US009858379B2

(12) United States Patent
Morisaki et al.

(10) Patent No.: US 9,858,379 B2
(45) Date of Patent: Jan. 2, 2018

(54) MASK DATA GENERATION SYSTEM, MASK DATA GENERATION METHOD, AND RECORDING MEDIUM

(71) Applicant: TOSHIBA MEMORY CORPORATION, Minato-ku (JP)

(72) Inventors: Tsuyoshi Morisaki, Yokkaichi (JP); Satoshi Usui, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 277 days.

(21) Appl. No.: 14/694,090

(22) Filed: Apr. 23, 2015

(65) Prior Publication Data
US 2016/0239601 A1 Aug. 18, 2016

Related U.S. Application Data

(60) Provisional application No. 62/117,771, filed on Feb. 18, 2015.

(51) Int. Cl.
*G06F 17/50* (2006.01)
*G03F 1/36* (2012.01)

(52) U.S. Cl.
CPC ............ *G06F 17/5081* (2013.01); *G03F 1/36* (2013.01)

(58) Field of Classification Search
CPC ................................ G06F 17/5081; G03F 1/36
USPC ........................................................ 716/53
See application file for complete search history.

(56) References Cited

U.S. PATENT DOCUMENTS

| 6,757,875 B2* | 6/2004 | Matsuoka | G03F 7/70616 716/51 |
| 9,489,479 B2* | 11/2016 | Liu | G03F 7/705 |
| 2013/0321610 A1* | 12/2013 | Momonoi | H04N 7/18 348/80 |
| 2014/0242498 A1 | 8/2014 | Kono et al. | |

FOREIGN PATENT DOCUMENTS

| JP | 2006-106528 | 4/2006 |
| JP | 2014-086439 | 5/2014 |
| JP | 2014-164201 | 9/2014 |

\* cited by examiner

*Primary Examiner* — Jack Chiang
*Assistant Examiner* — Brandon Bowers
(74) *Attorney, Agent, or Firm* — Oblon, McClelland, Maier & Neustadt, L.L.P.

(57) ABSTRACT

According to one embodiment, in a mask data generation system, a first acquisition part is configured to acquire pattern contour data included in each of a plurality of layout candidate data for a first layer. A second acquisition part is configured to acquire pattern contour data included in layout data for a second layer. A superimposing part is configured to superimpose the contour data acquired by the first acquisition part and the contour data acquired by the second acquisition part with each other, for each of the plurality of layout candidate data. An area calculation part is configured to calculate an overlap area between a first pattern in the contour data acquired by the first acquisition part and a second pattern in the contour data acquired by the second acquisition part, based on the superimposed data, for each of the plurality of layout candidate data.

17 Claims, 19 Drawing Sheets

FIG.11
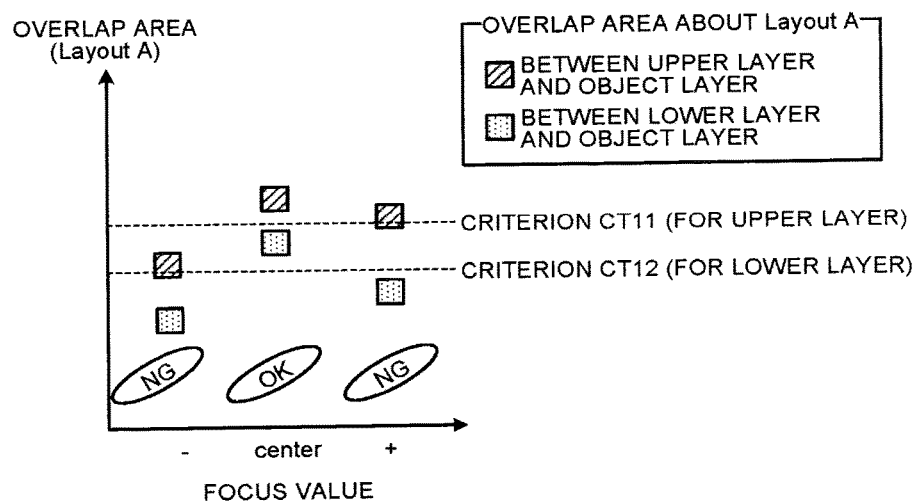
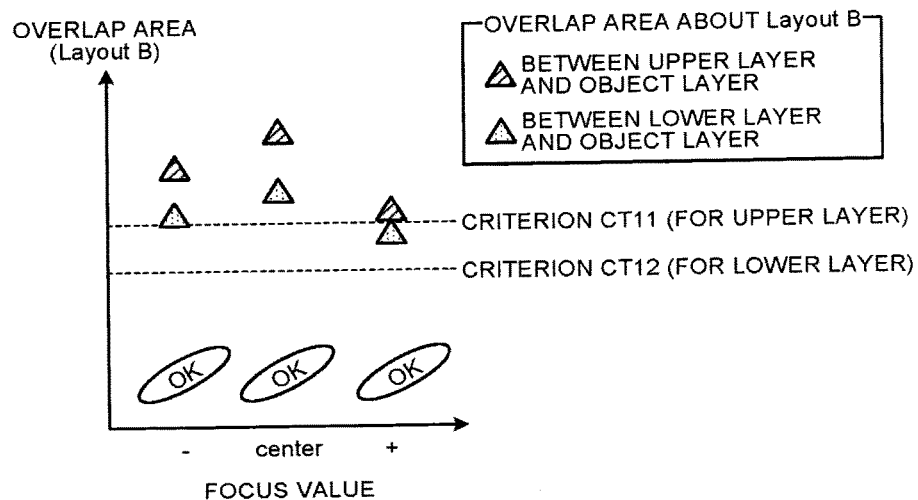

FIG.12
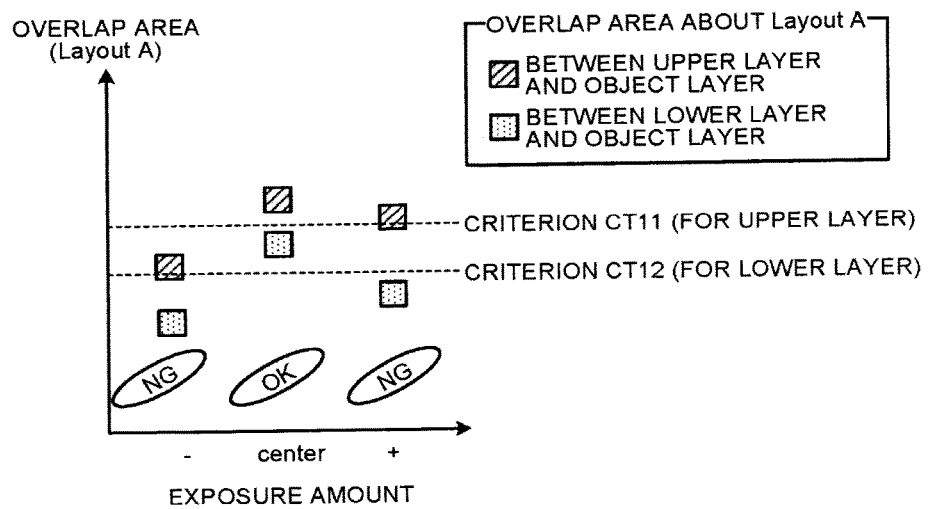
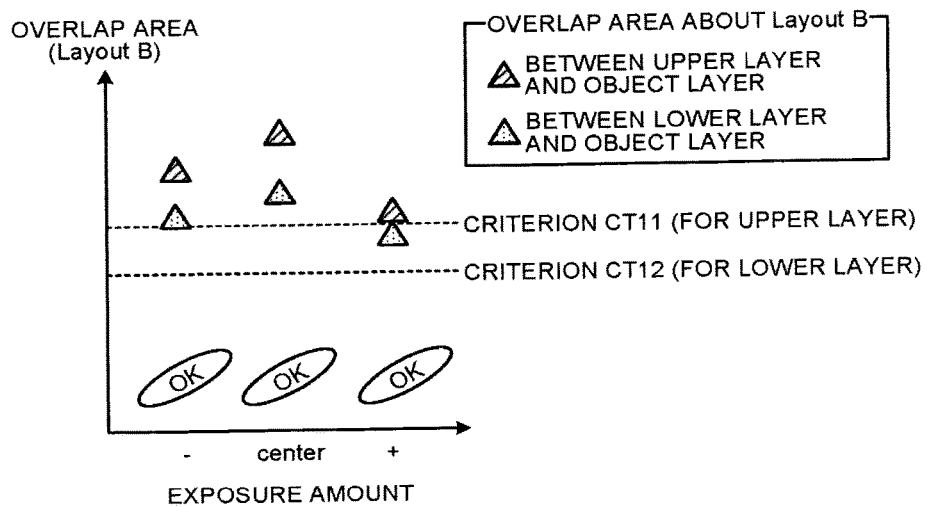

FIG.14
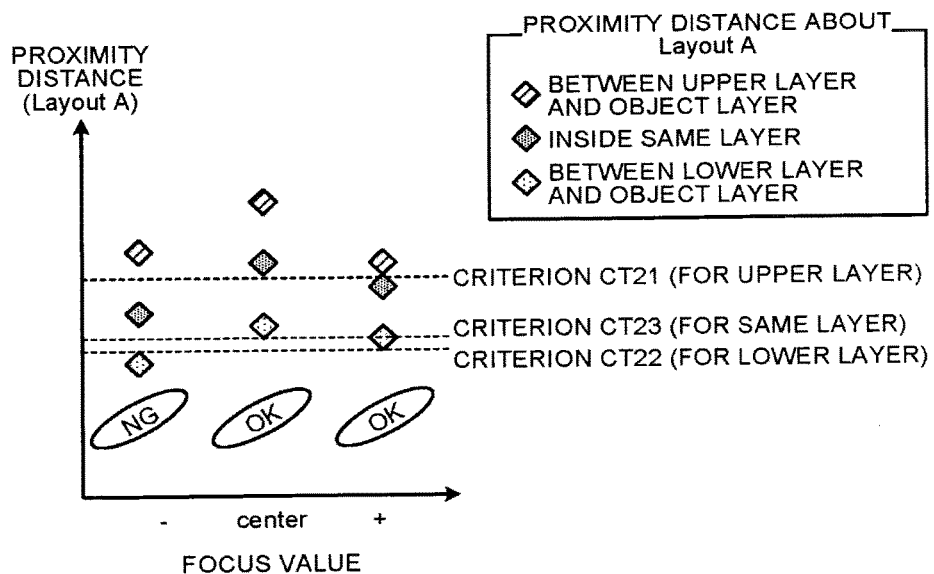
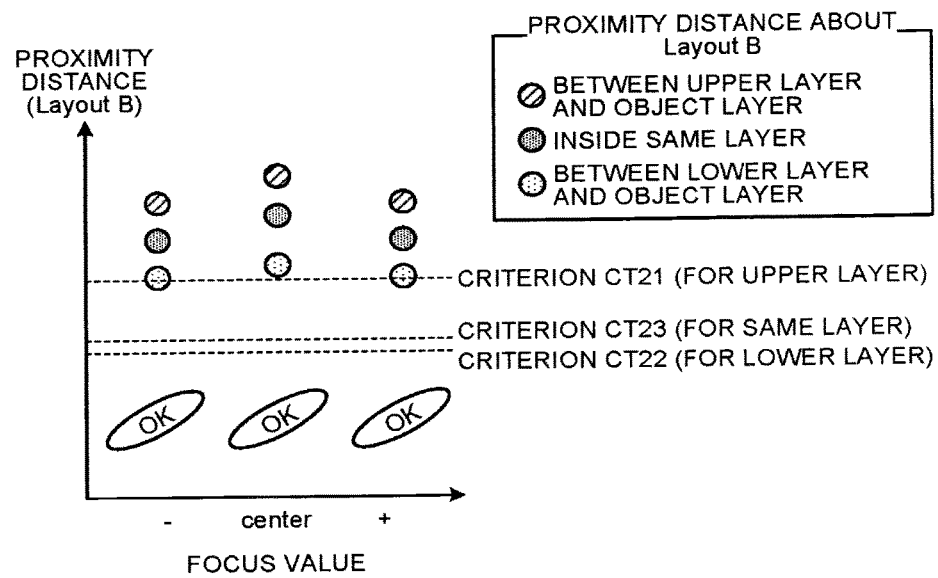

FIG.15
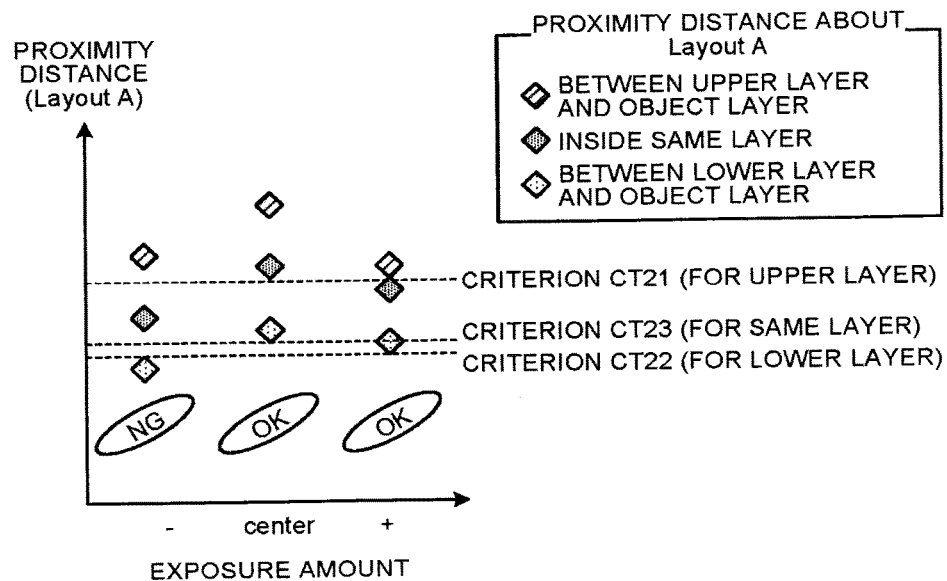
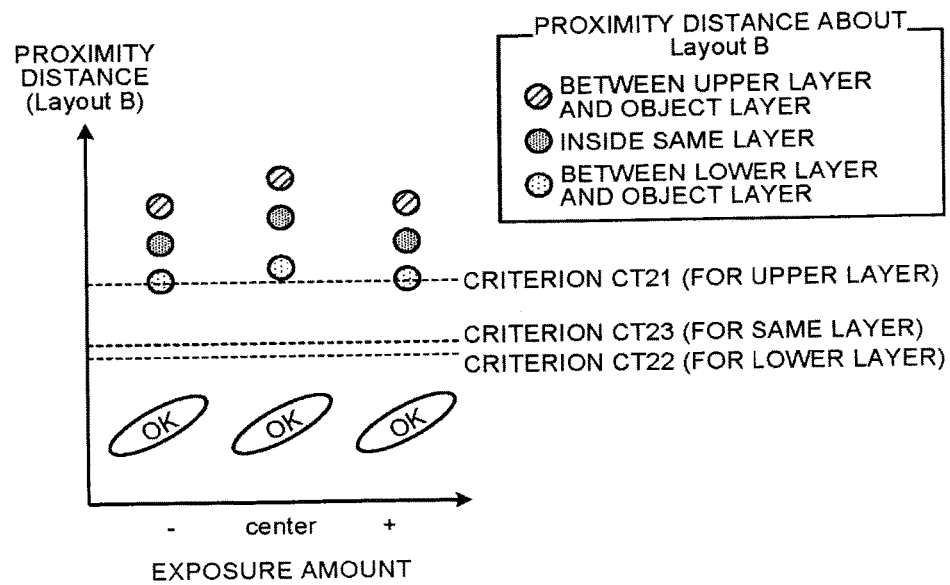

MASK DATA GENERATION SYSTEM, MASK DATA GENERATION METHOD, AND RECORDING MEDIUM

CROSS-REFERENCE TO RELATED APPLICATIONS

This application is based upon and claims the benefit of priority from U.S. Provisional Application No. 62/117,771, filed on Feb. 18, 2015; the entire contents of which are incorporated herein by reference.

FIELD

Embodiments described herein relate generally to a mask data generation system, a mask data generation method, and a recording medium.

BACKGROUND

In designing the layout of an integrated circuit of semiconductor devices, there is a case where a plurality of layout candidate data are designed for a single layer. At this time, it is desirable to select proper layout data from the plurality of layout candidate data and thereby to generate mask data.

BRIEF DESCRIPTION OF THE DRAWINGS

FIG. 11 is a view showing a result of comparing focus tolerances of overlap area about a plurality of layout candidate data in the embodiment;

FIG. 12 is a view showing a result of comparing exposure amount tolerances of overlap area about a plurality of layout candidate data in the embodiment;

FIG. 14 is a view showing a result of comparing focus tolerances of proximity distance about a plurality of layout candidate data in the embodiment;

FIG. 15 is a view showing a result of comparing exposure amount tolerances of proximity distance about a plurality of layout candidate data in the embodiment;

DETAILED DESCRIPTION

Figure 1:
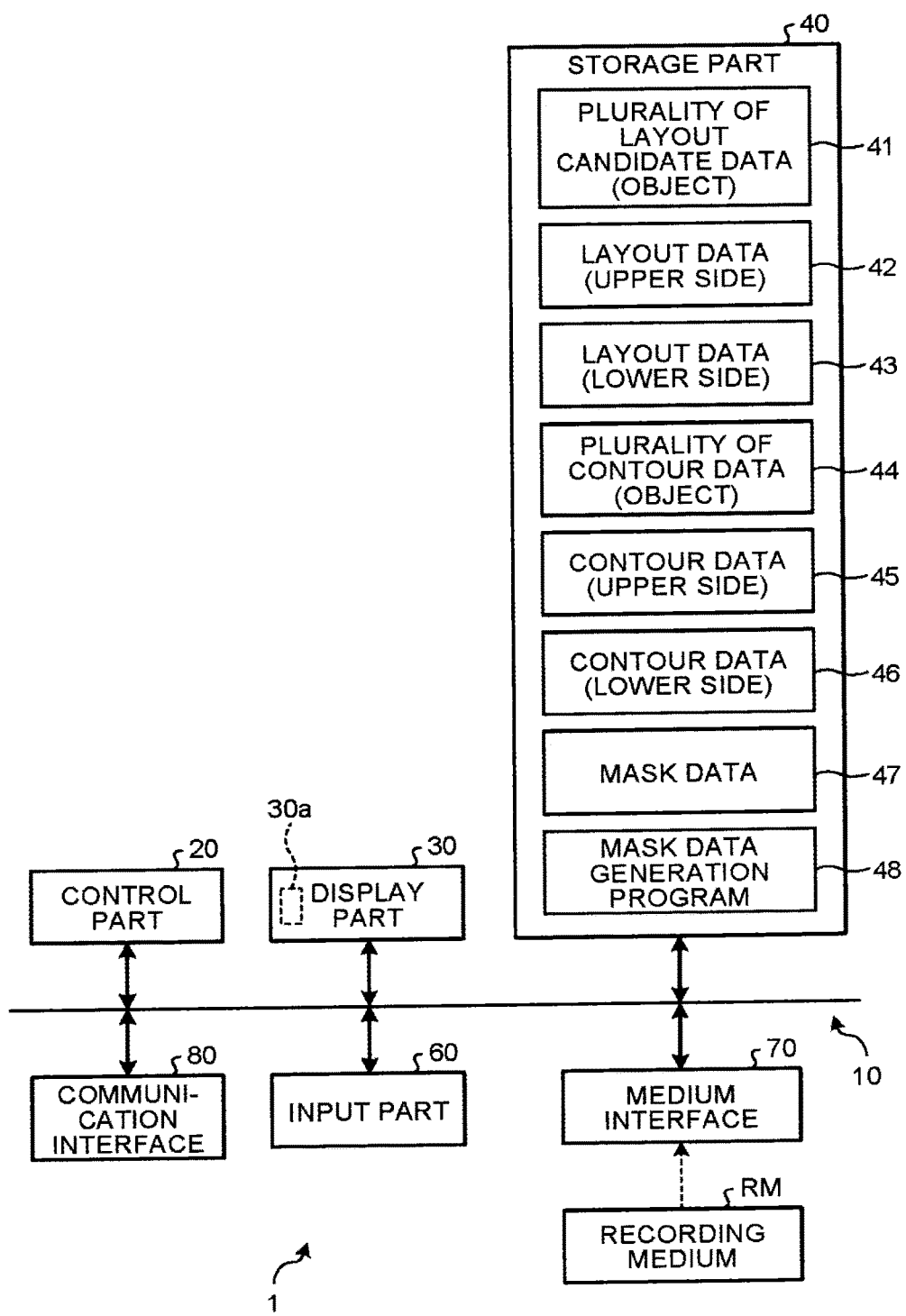
FIG. 1 is a view showing a configuration of a computer for executing a mask data generation program, according to an embodiment.

In general, according to one embodiment, there is provided a mask data generation system including a first acquisition part, a second acquisition part, a superimposing part, and an area calculation part. The first acquisition part is configured to acquire pattern contour data included in each of a plurality of layout candidate data for a first layer. The second acquisition part is configured to acquire pattern contour data included in layout data for a second layer. The superimposing part is configured to superimpose the contour data acquired by the first acquisition part and the contour data acquired by the second acquisition part with each other, for each of the plurality of layout candidate data. The area calculation part is configured to calculate an overlap area between a first pattern in the contour data acquired by the first acquisition part and a second pattern in the contour data acquired by the second acquisition part, based on the superimposed data, for each of the plurality of layout candidate data.

Exemplary embodiments of a mask data generation system, a mask data generation method, and a recording medium will be explained below in detail with reference to the accompanying drawings. The present invention is not limited to the following embodiments.

Embodiment

A mask data generation system, a mask data generation method, and a recording medium according to the embodiment are used, for example, in a lithography sequence of processes for manufacturing a semiconductor device. For example, when mask data including a hole pattern to be formed in a predetermined process object layer is generated, a mask data generation program is read from a recording medium and is executed by a computer (see FIG. 1), and the mask data is generated based on design layout data. A mask is produced by use of the mask data thus generated. Thereafter, the hole pattern is formed on a substrate, and then a conductive material (such as tungsten and/or copper) is embedded in the hole pattern, so that a plug wiring portion is formed.

In the case described above, when performing layout design of an integrated circuit of semiconductor devices, there is a case where a plurality of layout candidate data are designed for a single layer. At this time, it is desirable to select proper layout data from the plurality of layout candidate data and thereby to generate mask data.

For example, as a method for selecting a proper (such as optimum) layout from a plurality of layout candidates, the method described below can be considered. In accordance with a plurality of layout candidate data, a plurality of trial mask patterns are formed, and the plurality of trial mask patterns are transferred onto process object substrates to form a plurality of trial actual patterns. For each of the plurality of trial actual patterns, an SEM image is acquired. For example, in a case where a trial actual pattern is a hole pattern, elliptic approximation is performed to the contour of the trial actual pattern serving as an evaluation object on the SEM image, and the size and rotation angle of a pattern derived by the elliptic approximation are measured on the SEM image. Then, for each of the plurality of trial actual patterns, the deviation quantity of the measured size from a targeted size, and the deviation quantity of the measured rotation angle from a targeted rotation angle are evaluated. Then, one of the layout candidates, which corresponds to deviation quantities small enough to ensure a sufficient lithography margin, is selected as a proper (such as optimum) layout.

This method pays attention to a single layer as an adaptation (such as optimization) object, and evaluates a plurality of layout candidates for this single layer. However, as miniaturization of integrated circuits makes progress and thereby makes it difficult to ensure assumption, the erroneous difference between the actual contour of an evaluation object pattern and the contour derived by the elliptic approximation may come into a non-negligible state, in relation to patterns for the upper/lower layers. Consequently, even if a layout satisfies criteria for the size and the lithography margin in evaluation for a single layer, there may be a case where this layout is not a proper layout in relation to patterns for the upper/lower layers, due to dispersion or the like in actual pattern shape. For example, pattern-short may be caused, in association with patterns for the upper/lower layers, which need to be electrically separated, or the contact resistance value may be increased beyond an allowable level, in association with patterns for the upper/lower layers, which need to be electrically connected.

Specifically, if a plurality of layout candidates are evaluated by use of one-dimensional indexes, such as the pattern size and the rotation angle, a layout improper in relation to the upper/lower layers may be selected as a proper layout. Consequently, it may become difficult to select proper layout data from a plurality of layout candidate data, to generate mask data.

Also from now on, as miniaturization of integrated circuits makes progress and thereby makes criteria stricter, for example, in terms of the breakdown voltage and contact resistance value between patterns allowable in semiconductor device, it is expected that, in place of evaluation performed solely to an adaptation object layer, evaluation performed in consideration of the upper/lower layers as well will become more important.

Accordingly, in this embodiment, pattern contour data for the adaptation object layer and pattern contour data for the upper/lower layers are acquired, and they are superimposed with each other to obtain data, for each of a plurality of layout candidate data for the adaptation object layer. Then, on each of the superimposed data, evaluation is performed to proximity distances (one-dimensional index) in association with patterns for the upper/lower layers, which need to be electrically separated, and additional evaluation is further performed to overlap areas (two-dimensional index) in association with patterns for the upper/lower layers, which need to be electrically connected.

For example, a first pattern contour for the adaptation object layer and a third pattern contour for the upper/lower layers are superimposed with each other, and the proximity distance between the contours thereby obtained can be used as an evaluation index indicative of the easiness of short. The first pattern and the third pattern are patterns that need to be electrically separated from each other. Further, the overlap area thereby obtained between the first pattern contour for the adaptation object layer and a second pattern contour for the upper/lower layers can be used as an evaluation index indicative of the degree of contact resistance value. The first pattern and the second pattern are patterns that need to be electrically connected to each other. By use of these indexes, a proper layout for the adaptation object layer, which is proper in relation to the upper/lower layers, can be selected from the plurality of layout candidate data.

More specifically, a mask data generation program is executed by a computer 1 shown in FIG. 1. FIG. 1 is a view showing a configuration of the computer 1 for executing the mask data generation program.

The computer 1 includes a bus wiring 10, a control part 20, a display part 30, a storage part 40, an input part 60, a medium interface 70, and a communication interface 80.

The control part 20, the display part 30, the storage part 40, the input part 60, the medium interface 70, and the communication interface 80 are connected to each other via the bus wiring 10. The medium interface 70 is configured to connect a recording medium RM. The communication interface 80 is configured to receive information from the outside via a wired communication line or wireless communication line.

The storage part 40 stores a plurality of layout candidate data 41, layout data 42, layout data 43, a plurality of contour data 44, contour data 45, contour data 46, mask data 47, and a mask data generation program 48. In the following explanation, the adaptation object layer, the upper layer, and the lower layer will be referred to as Lop, Lup, and Ldn, respectively.

Here, the adaptation object layer Lop can be arbitrarily selected from a plurality of layers to be included in the mask data 47. The upper layer Lup is a layer above the adaptation object layer Lop, and is selected as a layer that should be evaluated in relation to the adaptation object layer Lop, from the plurality of layers to be included in the mask data 47. The lower layer Ldn is a layer below the adaptation object layer Lop, and is selected as a layer that should be evaluated in relation to the adaptation object layer Lop, from the plurality of layers to be included in the mask data 47.

Each of the plurality of layout candidate data 41 is data provided by layout design for the adaptation object layer Lop in designing an integrated circuit, and is used as a layout data candidate for the adaptation object layer Lop. The layout data 42 is data provided by layout design for the upper layer Lup in designing the integrated circuit. The upper layer Lup is a layer disposed above the adaptation object layer Lop. The layout data 43 is data provided by layout design for the lower layer Ldn in designing the integrated circuit. The lower layer Ldn is a layer disposed below the adaptation object layer Lop. The plurality of contour data 44 correspond to the plurality of layout candidate data 41. Each of the plurality of contour data 44 is data showing a pattern contour included in the corresponding layout candidate data of the plurality of layout candidate data 41. The contour data 45 corresponds to the layout data 42. The contour data 45 is data showing a pattern contour included in the layout data 42. The contour data 46 corresponds to the layout data 43. The contour data 46 is data showing a pattern contour included in the layout data 43. The mask data 47 is data for drawing patterns on a mask MK (see FIG. 17). The mask data generation program 48 is a program for generating the mask data 47. The mask MK is used for forming a latent image on a photosensitive material on a substrate through a projection optical system 215, by irradiating it with illumination light from an illumination optical system 214 of an exposure apparatus 201 (see FIG. 17).

The control part 20 is formed of, for example, a CPU, GPU, DSP, or micro-controller, and further includes a cache memory for temporary storage. The display part 30 is formed of a display device, such as a CRT display and/or liquid crystal display, and includes a screen 30a. The storage part 40 is formed of, for example, a memory and/or hard disk. The input part 60 is formed of, for example, a keyboard and/or mouse. The medium interface 70 is formed of, for example, a flexible disk drive, CD-ROM drive, and/or USB interface. The recording medium RM is formed of, for example, a flexible disk, CD-ROM, and/or USB memory. The communication interface 80 is an interface formed in accordance with a standard of wired communication or wireless communication.

Figure 2:
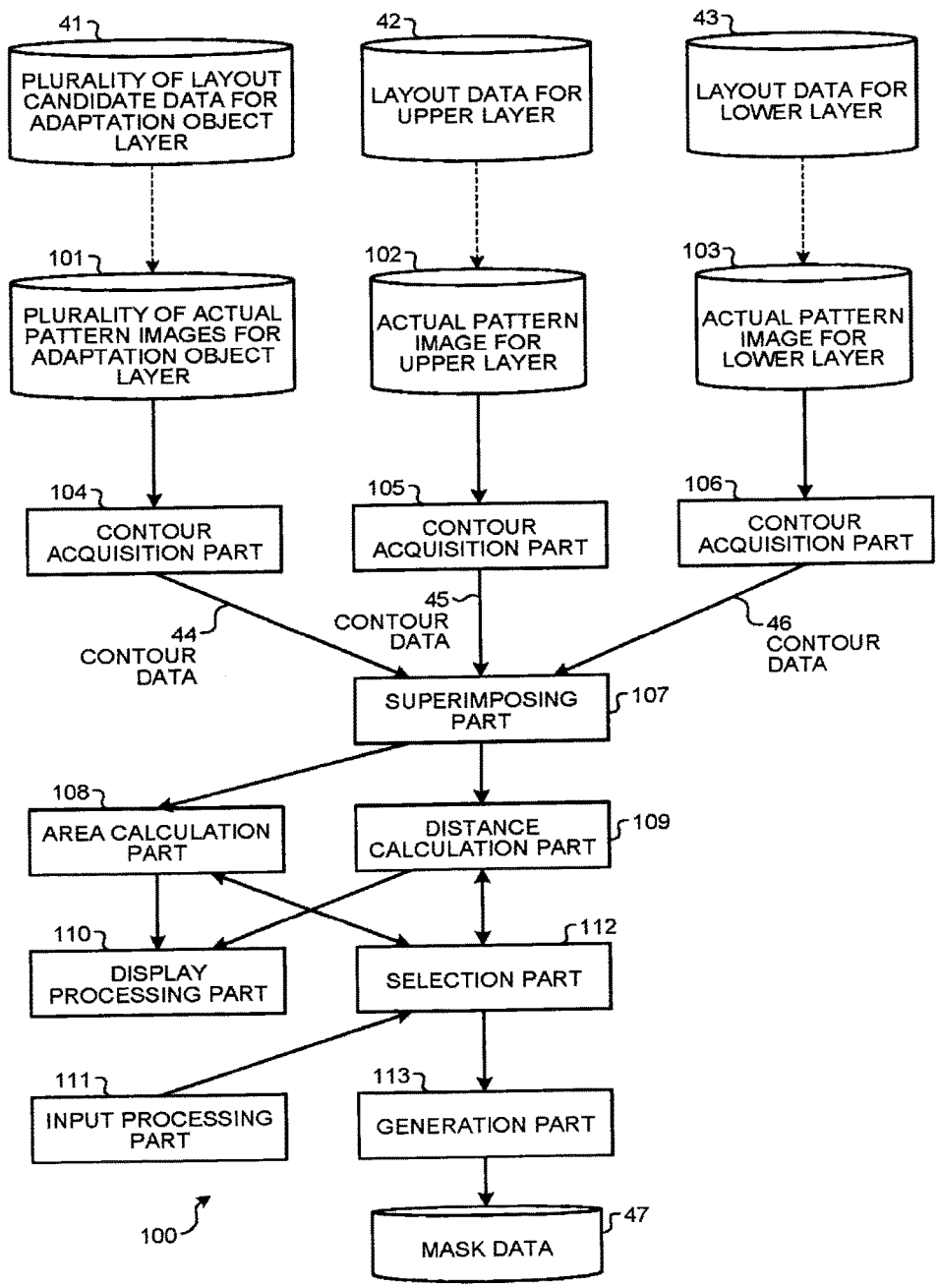
FIG. 2 is a view showing a configuration of a mask data generation system according to the embodiment.

Next, with reference to FIG. 2, an explanation will be given of a configuration of a mask data generation system 100, which is realized in the computer 1 by the mask data generation program. FIG. 2 is a view showing a configuration of the mask data generation system 100.

The mask data generation system 100 includes a contour acquisition part 104, a contour acquisition part 105, a contour acquisition part 106, a superimposing part 107, an area calculation part 108, a distance calculation part 109, a display processing part 110, an input processing part 111, a selection part 112, and a generation part 113.

The contour acquisition part 104 acquires data of a plurality of actual pattern images 101 for the adaptation object layer Lop. The plurality of actual pattern images 101 correspond to a plurality of layout candidate data 41 for the adaptation object layer Lop. Each of the actual pattern images 101 is an image obtained by measuring an actual pattern formed on a substrate in accordance with the corresponding layout candidate data.

For example, a trial mask pattern is formed in accordance with the corresponding layout candidate data, and the trial mask pattern is transferred onto a trial substrate, so that a trial actual pattern is formed. The trial actual pattern formed on the substrate is measured by a predetermined measuring method. The predetermined measuring method includes a measuring method, such as SEM, TEM, or AFM. Trial actual patterns formed on substrates are measured by the predetermined measuring method, so that data of the plurality of actual pattern images 101 are obtained. The contour acquisition part 104 acquires data of an actual pattern image 101, for each of the plurality of layout candidate data 41.

The contour acquisition part 104 acquires contour data 44 of an evaluation object pattern from an actual pattern image 101, for each of the plurality of layout candidate data 41. In many cases, each actual pattern image 101 is in a state where its contrast changes greatly at a portion corresponding to the contour of the evaluation object pattern. For example, each evaluation object pattern for the adaptation object layer Lop is a hole pattern.

It should be noted that the following explanation will be given of an example where each evaluation object pattern for the adaptation object layer Lop is a hole pattern, and the patterns for the upper layer Lup/the lower layer Ldn are line patterns, but a different pattern combination may be formed by a pattern for the adaptation object layer Lop and patterns for the upper layer Lup/the lower layer Ldn. For example, a pattern for the adaptation object layer Lop may be a line pattern, or at least one of patterns for the upper layer Lup/the lower layer Ldn may be a hole pattern.

Figure 3:
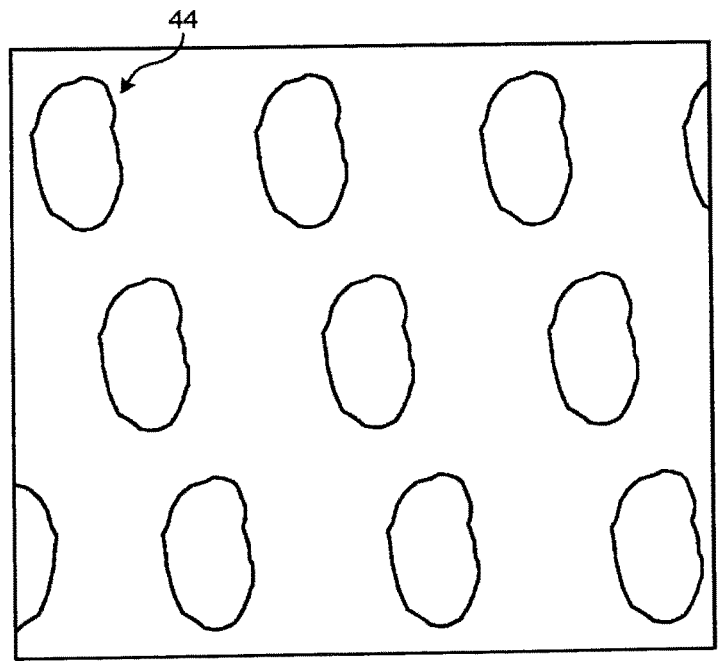
FIG. 3 is a view showing pattern contour data for an adaptation object layer in the embodiment.

As shown in FIG. 3, the contour acquisition part 104 extracts contour data 44 of an evaluation object pattern from an actual pattern image 101 by use of a well known edge detecting method, such as the Canny method. FIG. 3 is a view showing pattern contour data for the adaptation object layer. Consequently, the contour acquisition part 104 can acquire contour data 44 more approximated to the actual pattern contour included in the layout candidate data 41, as compared with a case where elliptic approximation is performed to the pattern contour included in the layout candidate data 41.

The contour acquisition part 104 can correlate each contour data 44 with information (layer candidate identifier) for identifying each of the plurality of layout candidate data 41. The contour acquisition part 104 supplies the contour data 44 thus correlated with a layer candidate identifier to the superimposing part 107, for each of the plurality of layout candidate data 41. The contour acquisition part 104 supplies a plurality of contour data 44 to the superimposing part 107.

The contour acquisition part 105 acquires data of an actual pattern image 102 for the upper layer Lup. The actual pattern image 102 corresponds to the layout data 42 for the upper layer Lup. The actual pattern image 102 is an image obtained by measuring an actual pattern formed on a substrate in accordance with the layout data 42. For example, a trial mask pattern is formed in accordance with the layout data 42, and the trial mask pattern is transferred onto a process object substrate, so that a trial actual pattern is formed. The trial actual pattern formed on the substrate is measured by a predetermined measuring method. The predetermined measuring method includes a measuring method, such as SEM, TEM, or AFM. The trial actual pattern formed on the substrate is measured by the predetermined measuring method, so that data of the actual pattern image 102 is obtained. The contour acquisition part 105 acquires data of the actual pattern image 102, for the layout data 42.

Figure 4:
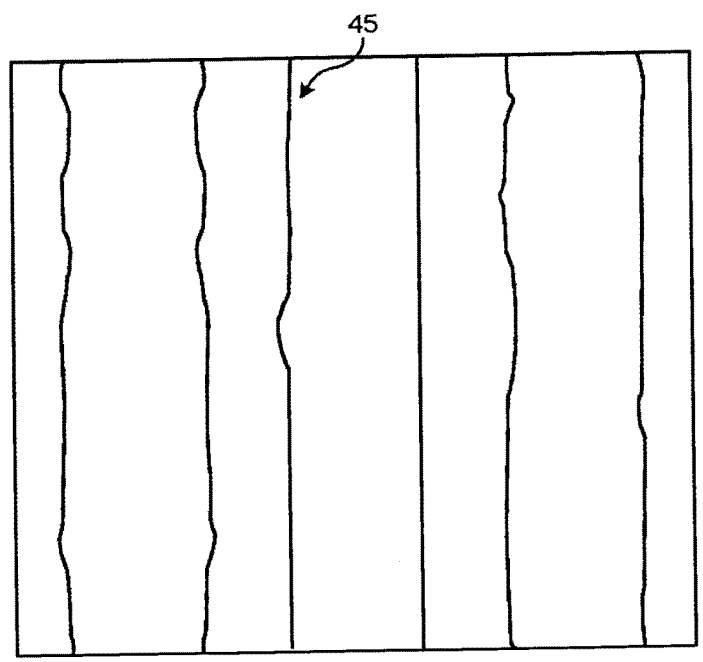
FIG. 4 is a view showing pattern contour data for an upper layer in the embodiment.

The contour acquisition part 105 acquires contour data 45 of an evaluation object pattern from the actual pattern image 102, for the layout data 42. In many cases, the actual pattern image 102 is in a state where its contrast changes greatly at a portion corresponding to the contour of the evaluation object pattern. As shown in FIG. 4, the contour acquisition part 105 extracts contour data 45 of the evaluation object pattern from the actual pattern image 102 by use of a well known edge detecting method, such as the Canny method. FIG. 4 is a view showing pattern contour data 45 for the upper layer Lup. Consequently, the contour acquisition part 105 can acquire contour data 45 more approximated to the actual pattern contour included in the layout data 42, as compared with a case where linear approximation is performed to the pattern contour included in the layout data 42.

The contour acquisition part 105 can correlate the contour data 45 with information (layer identifier) for identifying the layout data 42. The contour acquisition part 105 supplies the contour data 45 thus correlated with a layer identifier to the superimposing part 107, for the layout data 42.

The contour acquisition part 106 acquires data of an actual pattern image 103 for the lower layer Ldn. The actual pattern image 103 corresponds to the layout data 43 for the lower layer Ldn. The actual pattern image 103 is an image obtained by measuring an actual pattern formed on a substrate in accordance with the layout data 43. For example, a trial mask pattern is formed in accordance with the layout data 43, and the trial mask pattern is transferred onto a process object substrate, so that a trial actual pattern is formed. The trial actual pattern formed on the substrate is measured by a predetermined measuring method. The predetermined measuring method includes a measuring method, such as SEM, TEM, or AFM. The trial actual pattern formed on the substrate is measured by the predetermined measuring method, so that data of the actual pattern image 103 is obtained. The contour acquisition part 106 acquires data of the actual pattern image 103, for the layout data 43.

The contour acquisition part 106 acquires contour data 46 of an evaluation object pattern from the actual pattern image 103, for the layout data 43. In many cases, the actual pattern image 103 is in a state where its contrast changes greatly at a portion corresponding to the contour of the evaluation object pattern. The contour acquisition part 106 extracts contour data 46 of the evaluation object pattern (see the patterns shown by broken lines in FIG. 5) from the actual pattern image 103 by use of a well known edge detecting method, such as the Canny method. Consequently, the contour acquisition part 106 can acquire contour data 46 more approximated to the actual pattern contour included in the layout data 43, as compared with a case where linear approximation is performed to the pattern contour included in the layout data 43.

The contour acquisition part 106 can correlate the contour data 46 with information (layer identifier) for identifying the layout data 43. The contour acquisition part 106 supplies the contour data 46 thus correlated with a layer identifier to the superimposing part 107, for the layout data 43.

The superimposing part 107 receives the plurality of contour data 44 from the contour acquisition part 104, receives the contour data 45 from the contour acquisition part 105, and receives the contour data 46 from the contour acquisition part 106. The plurality of contour data 44 correspond to the plurality of layout candidate data 41 for the adaptation object layer Lop. The contour data 45 corresponds to the layout data 42 for the upper layer Lup. The contour data 46 corresponds to the layout data 43 for the lower layer Ldn. The superimposing part 107 selects contour data 44 serving as an evaluation object from the plurality of contour data 44, and superimposes the selected contour data 44 with the contour data 45 and the contour data 46.

Figure 5:
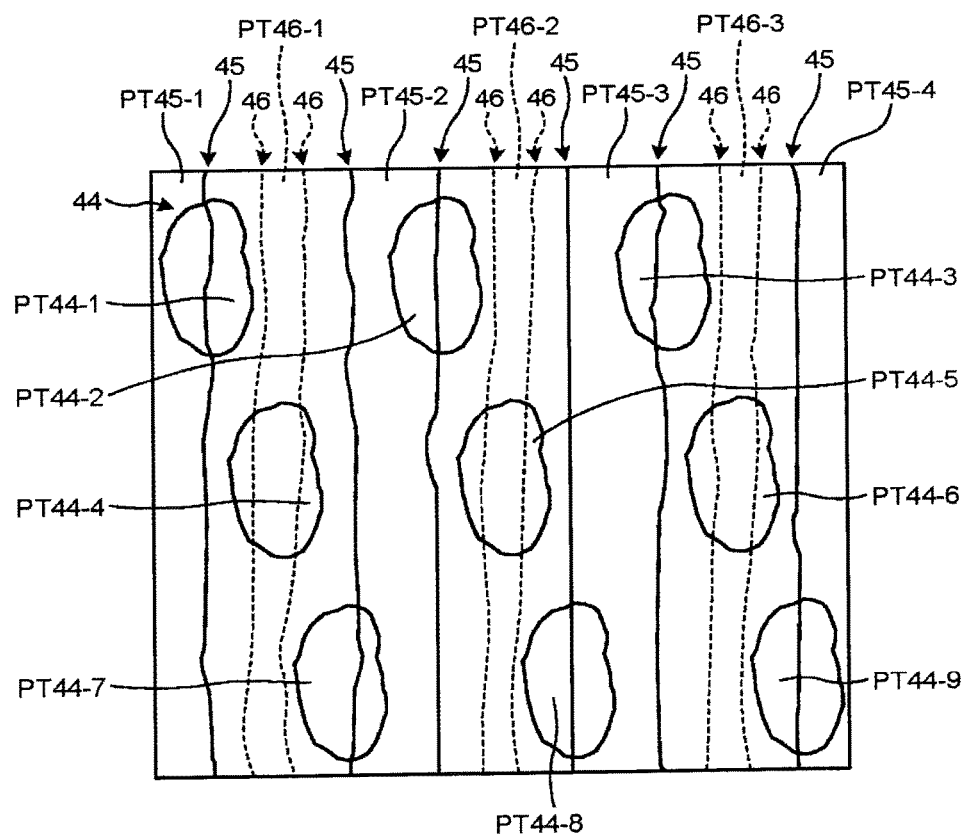
FIG. 5 is a view showing data obtained by superimposing contour data for the adaptation object layer with contour data for the upper/lower layers in the embodiment.

For example, as shown in FIG. 5, the superimposing part 107 superimposes contour data 44 of patterns PT44-1 to PT44-9 for the adaptation object layer Lop, contour data 45 of patterns PT45-1 to PT45-4 for the upper layer Lup, and contour data 46 of patterns PT46-1 to PT46-4 for the lower layer Ldn, with each other. FIG. 5 is a view showing data obtained by superimposing contour data for the adaptation object layer with contour data for the upper/lower layers.

The superimposing part 107 performs the superimposing process, for each of the plurality of layout candidate data 41. The superimposing part 107 supplies the superimposed data thus obtained to both of the area calculation part 108 and the distance calculation part 109, for each of the plurality of layout candidate data 41.

Based on the superimposed data obtained as described above, the area calculation part 108 calculates overlap areas OVA between the patterns PT44 in the contour data 44 and the patterns PT45 and PT46 in the contour data 45 and 46. The area calculation part 108 performs the process for calculating overlap areas OVA, for each of the plurality of layout candidate data 41.

Figure 6:
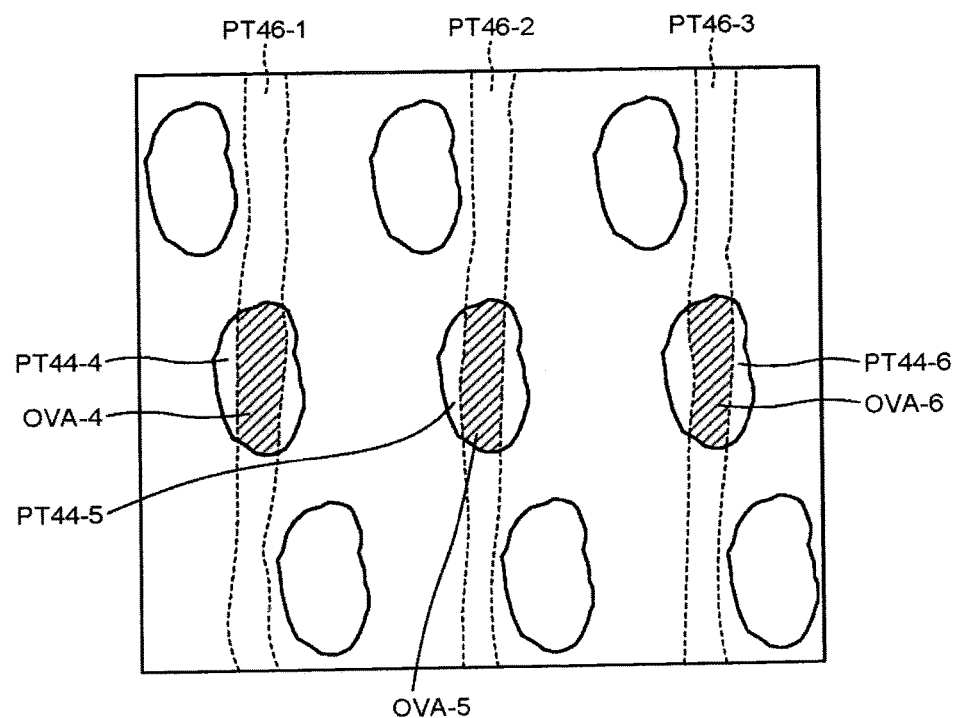
FIG. 6 is a view showing overlap areas between patterns for the adaptation object layer and patterns for the lower layer in the embodiment.

For example as shown in FIG. 6, the patterns PT44-4 to PT44-6 for the adaptation object layer Lop and the patterns PT46-1 to PT46-3 for the lower layer Ldn are patterns that need to be electrically connected to each other (to be set in contact with each other). FIG. 6 is a view showing overlap areas between patterns for the adaptation object layer Lop and patterns for the lower layer Ldn. The area calculation part 108 calculates overlap areas OVA-4 to OVA-6 between the patterns PT44-4 to PT44-6 and the patterns PT46-1 to PT46-3. The overlap areas OVA-4 to OVA-6 can be used as an evaluation index indicative of the degree of contact resistance values between the patterns PT44-4 to PT44-6 and the patterns PT46-1 to PT46-3.

Figure 7:
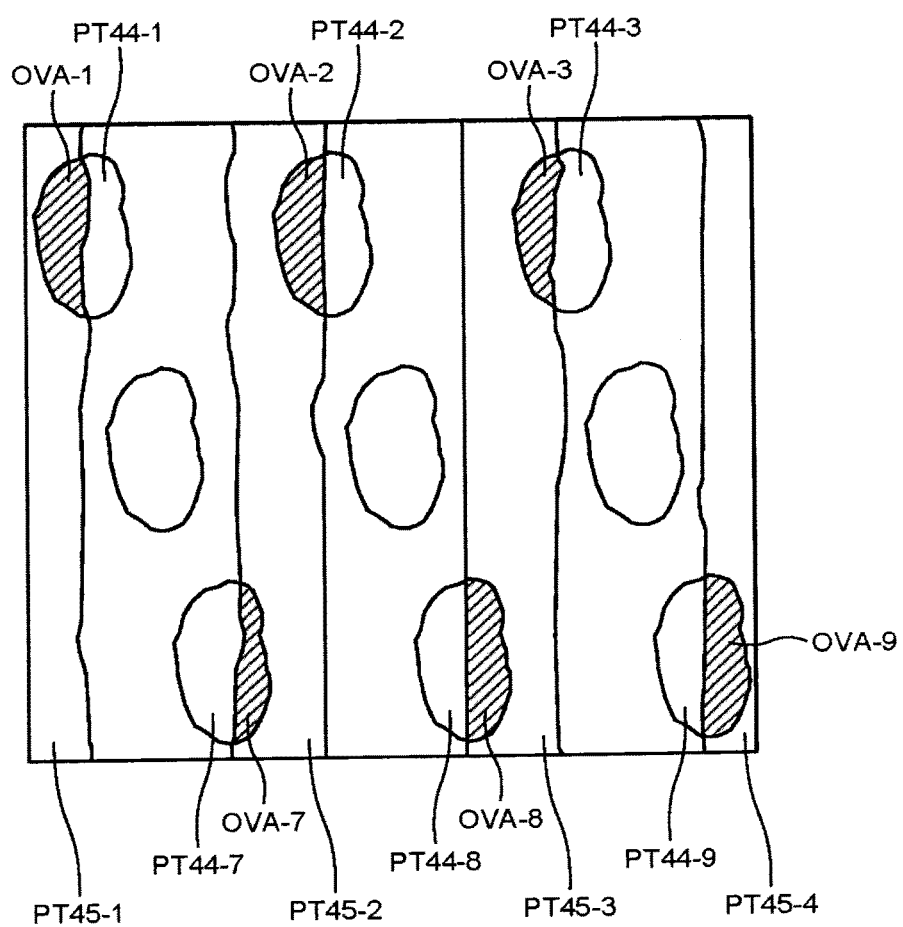
FIG. 7 is a view showing overlap areas between patterns for the adaptation object layer and patterns for the upper layer in the embodiment.

For example, as shown in FIG. 7, the patterns PT44-1 to PT44-3 and PT44-7 to PT44-9 for the adaptation object layer Lop and the patterns PT45-1 to PT45-4 for the upper layer Lup are patterns that need to be electrically connected to each other (to be set in contact with each other). FIG. 7 is a view showing overlap areas between patterns for the adaptation object layer Lop and patterns for the upper layer Lup. The area calculation part 108 calculates overlap areas OVA-1 to OVA-3 and OVA-7 to OVA-9 between the patterns PT44-1 to PT44-3 and PT44-7 to PT44-9 and the patterns PT45-1 to PT45-4 for the upper layer Lup. The overlap areas OVA-1 to OVA-3 and OVA-7 to OVA-9 can be used as an evaluation index indicative of the degree of contact resistance values between the patterns PT44-1 to PT44-3 and PT44-7 to PT44-9 and the patterns PT45-1 to PT45-4 for the upper layer Lup.

Based on the superimposed data obtained as described above, the distance calculation part 109 calculates proximity distances PD between the patterns PT44 in the contour data 44 and the patterns PT45 and PT46 in the contour data 45 and 46. The distance calculation part 109 performs the process for calculating proximity distances PD, for each of the plurality of layout candidate data 41.

Figure 8:
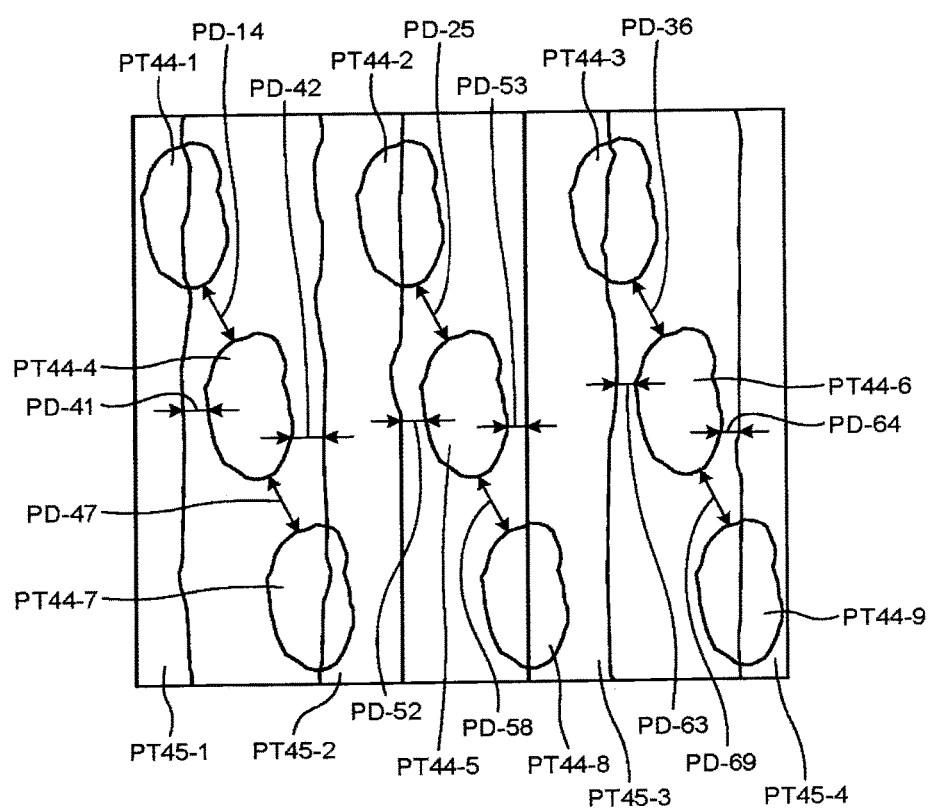
FIG. 8 is a view showing proximity distances between patterns for the adaptation object layer and patterns for the upper/same layers in the embodiment.

For example as shown in FIG. 8, the patterns PT44-4 to PT44-6 for the adaptation object layer Lop and the patterns PT45-1 to PT45-4 for the upper layer are patterns that need to be electrically separated from each other. FIG. 8 is a view showing proximity distances between patterns for the adaptation object layer Lop and patterns for the upper layer Lup/the same layer Lop. The distance calculation part 109 calculates proximity distances PD-41, PD-42, PD-52, PD-53, PD-63, and PD-64 between the patterns PT44-4 to PT44-6 and the patterns PT45-1 to PT45-4. The proximity distances PD-41, PD-42, PD-52, PD-53, PD-63, and PD-64 can be used as an evaluation index indicative of the easiness of short between the patterns PT44-4 to PT44-6 and the patterns PT45-1 to PT45-4.

Further, the patterns PT44-1 to PT44-9 inside the adaptation object layer Lop (inside the same layer Lop) are patterns that need to be electrically separated from each other. The distance calculation part 109 calculates proximity distances PD-14, PD-25, PD-36, PD-47, PD-58, and PD-69 between the patterns PT44-1 to PT44-9. The proximity distances PD-14, PD-25, PD-36, PD-47, PD-58, and PD-69 can be used as an evaluation index indicative of the easiness of short between the patterns PT44-1 to PT44-9.

Figure 9:
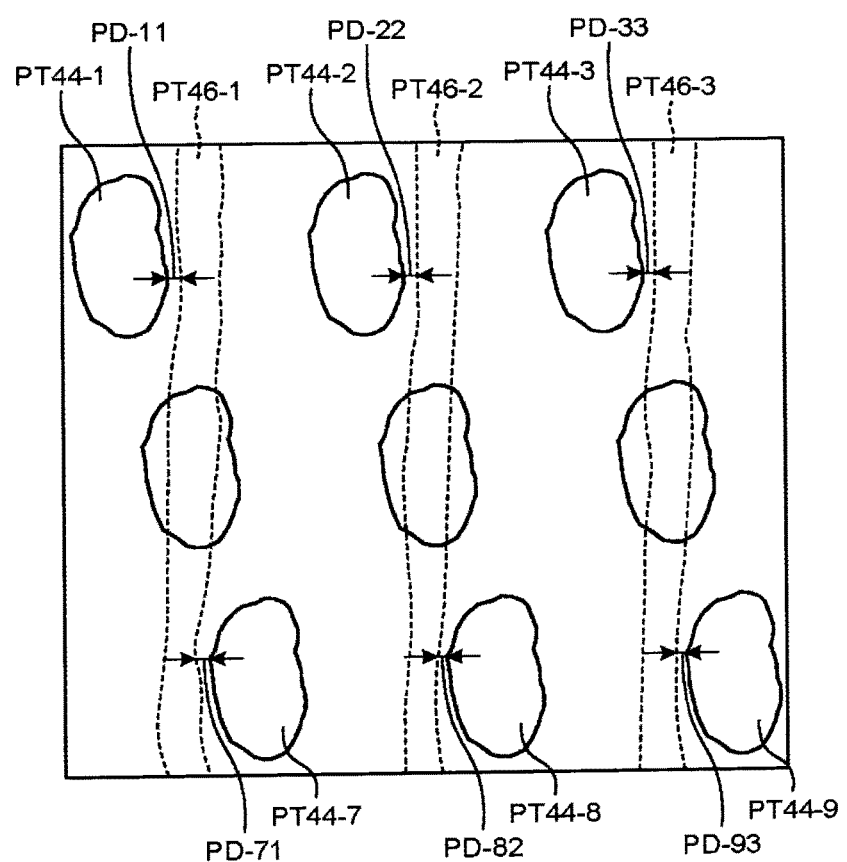
FIG. 9 is a view showing proximity distances between patterns for the adaptation object layer and patterns for the lower layer in the embodiment.

For example, as shown in FIG. 9, the patterns PT44-1 to PT44-3 and PT44-7 to PT44-9 for the adaptation object layer Lop and the patterns PT46-1 to PT46-3 for the lower layer Ldn are patterns that need to be electrically separated from each other. FIG. 9 is a view showing proximity distances between patterns for the adaptation object layer Lop and patterns for the lower layer Ldn. The distance calculation part 109 calculates proximity distances PD-11, PD-22, PD-33, PD-71, PD-82, and PD-93 between the patterns PT44-1 to PT44-3 and PT44-7 to PT44-9 and the patterns PT46-1 to PT46-3. The proximity distances PD-11, PD-22, PD-33, PD-71, PD-82, and PD-93 can be used as an evaluation index indicative of the easiness of short between the patterns PT44-1 to PT44-3 and PT44-7 to PT44-9 and the patterns PT46-1 to PT46-3.

Based on the overlap areas OVA calculated by the area calculation part 108 and the proximity distances PD calculated by the distance calculation part 109, the selection part 112 selects proper layout data for the adaptation object layer Lop from the plurality of layout candidate data 41. At this time, the selection part 112 may select the proper layout data by use of an interactive process, or may select the proper layout data by use of a batch process.

For example, in the case of selection of proper layout data by use of the interactive process, the area calculation part 108 supplies the calculated overlap areas to the display processing part 110, for each of the plurality of layout candidate data 41.

The display processing part 110 displays information concerning the calculated overlap areas on the screen 30a, for the plurality of layout candidate data 41 (see FIG. 1). The display processing part 110 includes overlap area related criteria. For example, the overlap area related criteria are composed of values experimentally predetermined as overlap area values, with which the contact resistance between patterns that need to be electrically connected to each other comes to be not larger than an allowable level.

Figure 10:
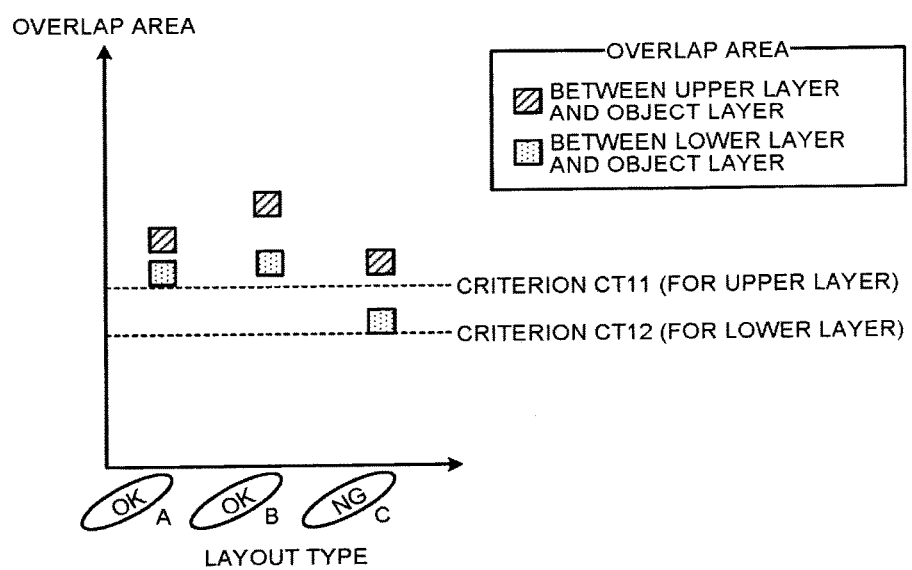
FIG. 10 is a view showing a result of comparing overlap areas about a plurality of layout candidate data in the embodiment.

For example, as shown in FIG. 10, the display processing part 110 displays a graph showing the overlap areas corresponding to the plurality of layout candidate data 41, and overlap area related criteria CT11 and CT12, on the screen 30a. FIG. 10 is a view showing a result of comparing overlap areas about a plurality of layout candidate data A, B, and C.

The criterion CT11 is a criterion that should be satisfied by overlap areas (see plots indicated by broken line hatching in FIG. 10) between patterns for the adaptation object layer Lop and patterns for the upper layer Lup. When an overlap area is not smaller than the criterion CT11, this overlap area is regarded as satisfying the criterion CT11. The criterion CT11 is experimentally predetermined in accordance with the pattern shape variation in the adaptation object layer Lop and the pattern shape variation in the upper layer Lup. As the pattern shape variation in the adaptation object layer Lop and the pattern shape variation in the upper layer Lup are larger, the criterion CT11 is set stricter. As the pattern shape variation in the adaptation object layer Lop and the pattern shape variation in the upper layer Lup are smaller, the criterion CT11 is set less strict.

The criterion CT12 is a criterion that should be satisfied by overlap areas (see plots indicated by dot hatching in FIG. 10) between patterns for the adaptation object layer Lop and patterns for the lower layer Ldn. When an overlap area is not smaller than the criterion CT12, this overlap area is regarded as satisfying the criterion CT12. The criterion CT12 is experimentally predetermined in accordance with the pattern shape variation in the adaptation object layer Lop and the pattern shape variation in the lower layer Ldn. As the pattern shape variation in the adaptation object layer Lop and the pattern shape variation in the lower layer Ldn are larger, the criterion CT12 is set stricter. As the pattern shape variation in the adaptation object layer Lop and the pattern shape variation in the lower layer Ldn are smaller, the criterion CT12 is set less strict.

Consequently, by viewing the screen 30a, users can recognize layout candidate data that satisfies the overlap area related criteria, from the plurality of layout candidate data 41. For example, in the example shown in FIG. 10, users can recognize each of the layout candidate data A and B as layout candidate data that satisfies the overlap area related criteria.

Further, for example, when there are a plurality of layout candidate data that satisfy the overlap area related criteria, the display processing part 110 displays information showing focus tolerances and/or exposure amount tolerances about this plurality of layout candidate data that satisfy the overlap area related criteria. In accordance with a display switching instruction from a user, the display processing part 110 can display the information showing focus tolerances and/or exposure amount tolerances about this plurality of layout candidate data that satisfy the overlap area related criteria.

For example, as shown in FIG. 11, for the plurality of layout candidate data A and B that satisfy the overlap area related criteria, the display processing part 110 displays a graph showing overlap areas relative to focus values different from each other, and the overlap area related criteria CT11 and CT12, on the screen 30a. FIG. 11 is a view showing a result of comparing focus tolerances of overlap area about the plurality of layout candidate data A and B.

Consequently, by viewing the screen 30a, users can recognize layout candidate data that has the largest focus tolerance of overlap area, from the plurality of layout candidate data 41 that satisfy the overlap area related criteria. For example, in the example shown in FIG. 11, relative to focus values different from each other, the layout candidate data A does not satisfy the criteria CT11 and CT12 in some cases, but the layout candidate data B satisfies the criteria CT11 and CT12. Accordingly, users can recognize the layout candidate data B as having the largest focus tolerance of overlap area.

For example, as shown in FIG. 12, for the plurality of layout candidate data A and B that satisfy the overlap area related criteria, the display processing part 110 displays a graph showing overlap areas relative to exposure amounts different from each other, and the overlap area related criteria CT11 and CT12, on the screen 30a. FIG. 12 is a view showing a result of comparing exposure amount tolerances of overlap area about the plurality of layout candidate data A and B.

Consequently, by viewing the screen 30a, users can recognize layout candidate data that has the largest exposure amount tolerance of overlap area, from the plurality of layout candidate data that satisfy the overlap area related criteria. For example, in the example shown in FIG. 12, relative to exposure amounts different from each other, the layout candidate data A does not satisfy the criteria CT11 and CT12 in some cases, but the layout candidate data B satisfies the criteria CT11 and CT12. Accordingly, users can recognize the layout candidate data B as having the largest exposure amount tolerance of overlap area.

Similarly, the distance calculation part 109 supplies the calculated proximity distances to the display processing part 110, for each of the plurality of layout candidate data 41.

The display processing part 110 displays information concerning the calculated proximity distances on the screen 30a, for the plurality of layout candidate data (see FIG. 1). The display processing part 110 includes proximity distance related criteria. For example, the proximity distance related criteria are composed of values experimentally calculated in advance as distance values in the planar direction, with which short is not caused between patterns that need to be electrically separated from each other.

Figure 13:
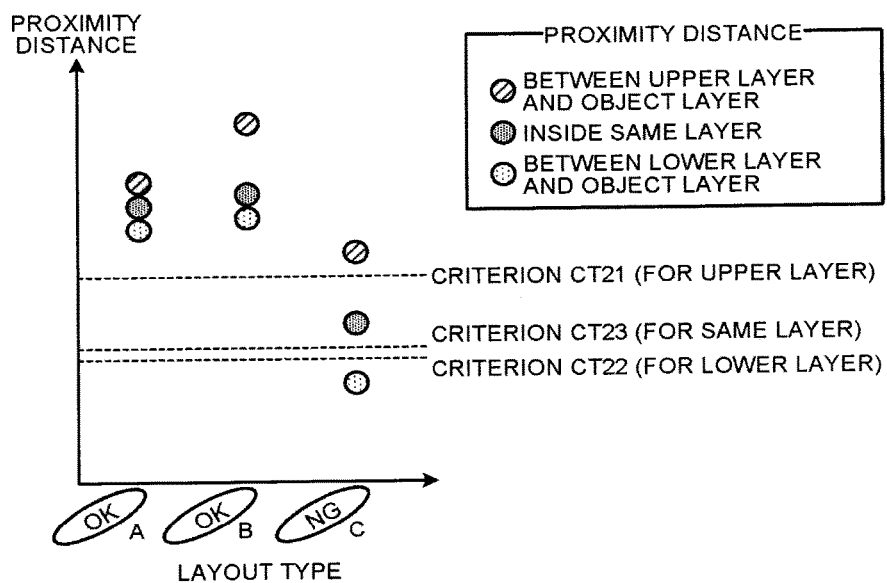
FIG. 13 is a view showing a result of comparing proximity distances about a plurality of layout candidate data in the embodiment.

For example, as shown in FIG. 13, the display processing part 110 displays a graph showing the proximity distances corresponding to the plurality of layout candidate data 41, and proximity distance related criteria CT21, CT22, and CT23, on the screen 30a. FIG. 13 is a view showing a result of comparing proximity distances about a plurality of layout candidate data A, B, and C.

The criterion CT21 is a criterion that should be satisfied by proximity distances (see plots indicated by broken line hatching in FIG. 13) between patterns for the adaptation object layer Lop and patterns for the upper layer Lup. When a proximity distance is not smaller than the criterion CT21, this proximity distance is regarded as satisfying the criterion CT21. The criterion CT21 is experimentally predetermined in accordance with the pattern shape variation in the adaptation object layer Lop and the pattern shape variation in the upper layer Lup. As the pattern shape variation in the adaptation object layer Lop and the pattern shape variation in the upper layer Lup are larger, the criterion CT21 is set stricter. As the pattern shape variation in the adaptation object layer Lop and the pattern shape variation in the upper layer Lup are smaller, the criterion CT21 is set less strict.

The criterion CT22 is a criterion that should be satisfied by proximity distances (see plots indicated by low density dot hatching in FIG. 13) between patterns for the adaptation object layer Lop and patterns for the lower layer Ldn. When a proximity distance is not smaller than the criterion CT22, this proximity distance is regarded as satisfying the criterion CT22. The criterion CT22 is experimentally predetermined in accordance with the pattern shape variation in the adaptation object layer Lop and the pattern shape variation in the lower layer Ldn. As the pattern shape variation in the adaptation object layer Lop and the pattern shape variation in the lower layer Ldn are larger, the criterion CT22 is set stricter. As the pattern shape variation in the adaptation object layer Lop and the pattern shape variation in the lower layer Ldn are smaller, the criterion CT22 is set less strict.

The criterion CT23 is a criterion that should be satisfied by proximity distances (see plots indicated by high density dot hatching in FIG. 13) between patterns inside the adaptation object layer Lop (inside the same layer Lop). When a proximity distance is not smaller than the criterion CT23, this proximity distance is regarded as satisfying the criterion CT23. The criterion CT23 is experimentally predetermined in accordance with the pattern shape variation inside the adaptation object layer Lop. As the pattern shape variation inside the adaptation object layer Lop is larger, the criterion CT23 is set stricter. As the pattern shape variation inside the adaptation object layer Lop is smaller, the criterion CT23 is set less strict.

Consequently, by viewing the screen 30a, users can recognize layout candidate data that satisfies the proximity distance related criteria, from the plurality of layout candidate data 41. For example, in the example shown in FIG. 13, users can recognize each of the layout candidate data A and B as layout candidate data that satisfies the proximity distance related criteria.

Further, for example, when there are a plurality of layout candidate data that satisfy the proximity distance related criteria, the display processing part 110 displays information showing focus tolerances and/or exposure amount tolerances about this plurality of layout candidate data that satisfy the proximity distance related criteria. In accordance with a display switching instruction from a user, the display processing part 110 can display the information showing focus tolerances and/or exposure amount tolerances about this plurality of layout candidate data that satisfy the proximity distance related criteria.

For example, as shown in FIG. 14, for the plurality of layout candidate data A and B that satisfy the proximity distance related criteria, the display processing part 110 displays a graph showing proximity distances relative to focus values different from each other, and the proximity distance related criteria CT21, CT22, and CT23, on the screen 30a (see FIG. 14). FIG. 14 is a view showing a result of comparing focus tolerances of proximity distance about the plurality of layout candidate data A and B.

Consequently, by viewing the screen 30a, users can recognize layout candidate data that has the largest focus tolerance of proximity distance, from the plurality of layout candidate data that satisfy the overlap area related criteria. For example, in the example shown in FIG. 14, relative to focus values different from each other, the layout candidate data A does not satisfy the criteria CT21, CT22, and CT23 in some cases, but the layout candidate data B satisfies the criteria CT21, CT22, and CT23. Accordingly, users can recognize the layout candidate data B as having the largest focus tolerance of proximity distance.

For example, as shown in FIG. 15, for the plurality of layout candidate data A and B that satisfy the proximity distance related criteria, the display processing part 110 displays a graph showing overlap areas relative to exposure amounts different from each other, and the proximity distance related criteria CT21, CT22, and CT23, on the screen 30a. FIG. 15 is a view showing a result of comparing exposure amount tolerances of proximity distance about the plurality of layout candidate data A and B.

Consequently, by viewing the screen 30a, users can recognize layout candidate data that has the largest exposure amount tolerance of proximity distance, from the plurality of layout candidate data that satisfy the proximity distance related criteria. For example, in the example shown in FIG. 15, relative to exposure amounts different from each other, the layout candidate data A does not satisfy the criteria CT21, CT22, and CT23 in some cases, but the layout candidate data B satisfies the criteria CT21, CT22, and CT23. Accordingly, users can recognize the layout candidate data B as having the largest exposure amount tolerance of proximity distance.

A selecting instruction for selecting layout candidate data that satisfies the overlap area related criteria and the proximity distance related criteria is input into the input processing part 111 by a user through the input part 60 (see FIG. 1). Alternatively, a selecting instruction for selecting layout candidate data that is largest in the focus tolerance and/or the exposure amount tolerance is input into the input processing part 111 by a user. For example, the examples shown in FIGS. 10 to 15, a selecting instruction for selecting the layout candidate data B, which is largest in the focus tolerance and/or the exposure amount tolerance, is input into the input processing part 111 from a user.

Upon receiving a selecting instruction from a user, the input processing part 111 transfers the selecting instruction from the user to the selection part 112.

In accordance with the selecting instruction from the user, the selection part 112 selects proper layout data for the adaptation object layer Lop, from the plurality of layout candidate data 41. The selection part 112 supplies the layout data thus selected to the generation part 113.

Alternatively, for example, in the case of selection of proper layout data by use of a batch process, the area calculation part 108 supplies the calculated overlap areas to the selection part 112, for each of the plurality of layout candidate data 41.

The selection part 112 compares the calculated overlap areas between the plurality of layout candidate data 41, and selects proper layout data for the adaptation object layer Lop, from the plurality of layout candidate data 41, in accordance with the comparison result. The selection part 112 includes overlap area related criteria.

The selection part 112 compares the overlap areas with the overlap area related criteria, for each of the plurality of layout candidate data 41. The selection part 112 selects layout candidate data whose overlap areas are not smaller than the overlap area related criteria, from the plurality of layout candidate data 41, as layout candidate data that satisfies the overlap area related criteria (see FIG. 10).

Further, for example, when there are a plurality of layout candidate data that satisfy the overlap area related criteria, the selection part 112 compares focus tolerances and/or exposure amount tolerances about this plurality of layout candidate data that satisfy the overlap area related criteria.

The selection part 112 compares overlap areas relative to a plurality of focus values different from each other, with the overlap area related criteria, for each of the plurality of layout candidate data that satisfy the overlap area related criteria (see FIG. 11). From the plurality of layout candidate data that satisfy the overlap area related criteria, the selection part 112 selects layout candidate data whose overlap areas relative to the plurality of focus values satisfy the overlap area related criteria, as layout candidate data having the largest focus tolerance.

The selection part 112 compares overlap areas relative to a plurality of exposure amounts different from each other, with the overlap area related criteria, for each of the plurality of layout candidate data that satisfy the overlap area related criteria (see FIG. 12). From the plurality of layout candidate data that satisfy the overlap area related criteria, the selection part 112 selects layout candidate data whose overlap areas relative to the plurality of exposure amounts satisfy the overlap area related criteria, as layout candidate data having the largest focus tolerance.

Similarly, the distance calculation part 109 supplies the calculated proximity distances to the selection part 112, for each of the plurality of layout candidate data 41.

The selection part 112 compares the calculated proximity distances between the plurality of layout candidate data 41, and selects proper layout data for the adaptation object layer Lop, from the plurality of layout candidate data 41, in accordance with the comparison result. The selection part 112 includes proximity distance related criteria.

The selection part 112 compares the proximity distances with the proximity distance related criteria, for each of the plurality of layout candidate data 41. The selection part 112 selects layout candidate data whose proximity distances are not smaller than the proximity distance related criteria, from the plurality of layout candidate data 41, as layout candidate data that satisfies the proximity distance related criteria (see FIG. 13).

Further, for example, when there are a plurality of layout candidate data that satisfy the proximity distance related criteria, the selection part 112 compares focus tolerances and/or exposure amount tolerances about this plurality of layout candidate data that satisfy the proximity distance related criteria.

The selection part 112 compares proximity distances relative to a plurality of focus values different from each other, with the proximity distance related criteria, for each of the plurality of layout candidate data that satisfy the proximity distance related criteria (see FIG. 14). From the plurality of layout candidate data that satisfy the proximity distance related criteria, the selection part 112 selects layout candidate data whose proximity distances relative to the plurality of focus values satisfy the proximity distance related criteria, as layout candidate data having the largest focus tolerance.

The selection part 112 compares proximity distances relative to a plurality of exposure amounts different from each other, with the proximity distance related criteria, for each of the plurality of layout candidate data that satisfy the proximity distance related criteria (see FIG. 15). From the plurality of layout candidate data that satisfy the proximity distance related criteria, the selection part 112 selects layout candidate data whose proximity distances relative to the plurality of exposure amounts satisfy the proximity distance related criteria, as layout candidate data having the largest focus tolerance.

When there is only one layout candidate data specified as satisfying the overlap area related criteria and/or the proximity distance related criteria, the selection part 112 selects the specified sole layout candidate data as proper layout data. Where there are a plurality of layout candidate data that satisfy the overlap area related criteria and/or the proximity distance related criteria, the selection part 112 selects layout candidate data that is largest in the focus tolerance and/or the exposure amount tolerance, from this plurality of layout candidate data, as proper layout data. The selection part 112 supplies the selected layout data to the generation part 113.

The generation part 113 generates mask data 47 including the proper layout data selected by the selection part 112, and stores it in the storage part 40.

Figure 16:
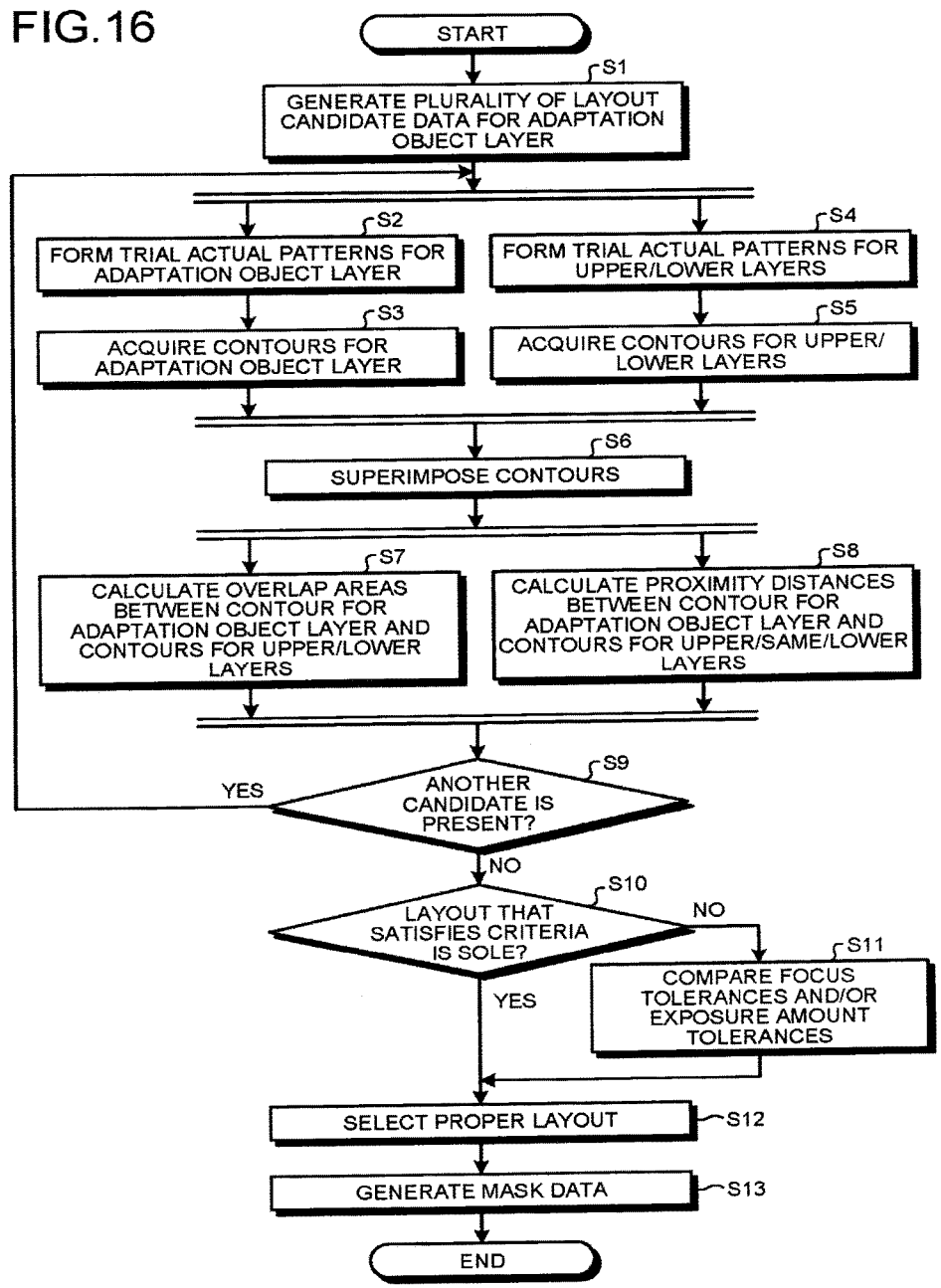
FIG. 16 is a flow chart showing a mask data generation method according to the embodiment.

Next, with reference to FIG. 16, an explanation will be given of a mask data generation method according to this embodiment. FIG. 16 is a flow chart showing a mask data generation method.

An information processing apparatus (not shown) generates a plurality of layout candidate data 41 for the adaptation object layer Lop, by use of a layout design tool (S1). The control part 20 of the computer 1 generates layout data 42 for the upper layer Lup, and generates layout data 43 for the lower layer Ldn.

A start command of the mask data generation program 48 is input into the input part 60 by a user. The control part 20 receives the start command of the mask data generation program 48, and activates the mask data generation program 48 with reference to the storage part 40, based on this start command. In accordance with the mask data generation program 48, the control part 20 acquires the plurality of layout candidate data 41, the layout data 42, and the layout data 43 from the information processing apparatus. The control part 20 may acquire these data via a recording medium RM by use of the medium interface 70, or may acquire these data via a wired communication line or wireless communication line by use of the communication interface 80.

In response to this, a process for acquiring pattern contours for the adaptation object layer Lop (S2 to S3) and a process for acquiring contours for the upper layer Lup/the lower layer Ldn (S4 to S5) are performed in parallel with each other.

More specifically, in the process for acquiring pattern contours for the adaptation object layer Lop, the control part 20 forms trial mask patterns in accordance with layout candidate data serving as evaluation objects for the adaptation object layer Lop, and produces trial masks. Each trial mask is conveyed to the exposure apparatus 201 (see FIG. 17), and the exposure apparatus 201 transfers the trial mask pattern onto a trial substrate and thereby forms a latent image of a trial actual pattern. Thereafter, each trial substrate is conveyed to a developing apparatus (not shown), and the developing apparatus develops the latent image of the trial actual pattern on the trial substrate (S2).

The trial substrates respectively including the trial actual patterns thus developed are conveyed to a predetermined measuring apparatus (not shown), and the predetermined measuring apparatus performs measurement to the trial actual patterns and thereby generates data of actual pattern images 101 as a measure result. The predetermined measuring apparatus is formed of, for example, an SEM apparatus, TEM apparatus, or AFM apparatus.

In accordance with the mask data generation program 48, the control part 20 acquires the data of the actual pattern images 101 from the predetermined measuring apparatus. The control part 20 may acquire the data of the actual pattern images 101 via a recording medium RM by use of the medium interface 70, or may acquire the data of the actual pattern images 101 via a wired communication line or wireless communication line by use of the communication interface 80.

The control part 20 acquires contour data 44 of evaluation object patterns from the actual pattern images 101 (S3). The control part 20 extracts the contour data 44 of evaluation object patterns (see FIG. 3) from the actual pattern images 101 by use of a well known edge detecting method, such as the Canny method.

On the other hand, in the process for acquiring contours for the upper layer Lup/the lower layer Ldn, the control part 20 forms trial mask patterns in accordance with layout data for the upper layer Lup/the lower layer Ldn, and produces trial masks. Each trial mask is conveyed to the exposure apparatus 201 (see FIG. 17), and the exposure apparatus 201 transfers the trial mask pattern onto a trial substrate and thereby forms a latent image of a trial actual pattern. Thereafter, each trial substrate is conveyed to a developing apparatus (not shown), and the developing apparatus develops the latent image of the trial actual pattern on the trial substrate (S4).

The trial substrates respectively including the trial actual patterns thus developed are conveyed to a predetermined measuring apparatus (not shown), and the predetermined measuring apparatus performs measurement to the trial actual patterns and thereby generates data of actual pattern images 101 as a measure result. The predetermined measuring apparatus is formed of, for example, an SEM apparatus, TEM apparatus, or AFM apparatus.

In accordance with the mask data generation program 48, the control part 20 acquires the data of the actual pattern images 102 and 103 from the predetermined measuring apparatus. The control part 20 may acquire the data of the actual pattern images 102 and 103 via a recording medium RM by use of the medium interface 70, or may acquire the data of the actual pattern images 102 and 103 via a wired communication line or wireless communication line by use of the communication interface 80.

The control part 20 acquires contour data 45 and 46 of evaluation object patterns from the actual pattern images 102 and 103 (S5). The control part 20 extracts the contour data 45 and 46 of evaluation object patterns (see FIG. 4) from the actual pattern images 102 and 103 by use of a well known edge detecting method, such as the Canny method.

Thereafter, the control part 20 waits until completion of both of the process for acquiring pattern contours for the adaptation object layer Lop (S2 to S3) and a process for acquiring contours for the upper layer Lup/the lower layer Ldn (S4 to S5). Upon completion of both of the process for acquiring pattern contours for the adaptation object layer Lop (S2 to S3) and a process for acquiring contours for the upper layer Lup/the lower layer Ldn (S4 to S5), the control part 20 superimposes the pattern contour data 44 for the adaptation object layer Lop with the pattern contour data 45 and 46 for the upper layer Lup/the lower layer Ldn (S6).

In response to this, based on the superimposed data thus obtained, a process for calculating overlap areas OVA (S7) and a process for calculating proximity distances PD are performed in parallel with each other.

More specifically, in the process for calculating overlap areas OVA, the control part 20 calculates overlap areas OVA between the patterns PT44 in the contour data 44 and the patterns PT45 and PT46 in the contour data 45 and 46 (see FIGS. 6 and 7), based on the superimposed data obtained as described above. In other words, the control part 20 calculates overlap areas OVA between the patterns PT44 for the adaptation object layer Lop and the patterns for the upper layer Lup/the lower layer Ldn (S7).

On the other hand, in the process for calculating proximity distances PD, the control part 20 calculates proximity distances PD between the patterns PT44 in the contour data 44 and the patterns PT45 and PT46 in the contour data 45 and 46 (see FIGS. 8 and 9), based on the superimposed data obtained as described above. In other words, the control part 20 calculates proximity distances PD between the patterns PT44 for the adaptation object layer Lop and the patterns for the upper layer Lup/the lower layer Ldn (S8).

Further, the control part 20 calculates proximity distances PD between the patterns PT44 inside the contour data 44 (see FIG. 8), based on the superimposed data obtained as described above. In other words, the control part 20 calculates proximity distances PD between the patterns PT44 inside the adaptation object layer Lop (inside the same layer Lop) (S8).

Thereafter, the control part 20 waits until completion of both of the process for calculating overlap areas OVA (S7) and the process for calculating proximity distances PD (S8). Upon completion of both of the process for calculating overlap areas OVA (S7) and the process for calculating proximity distances PD (S8), the control part 20 makes a judgment as to whether or not the plurality of layout candidate data 41 include any layout candidate data not yet subjected to the selection (S9).

If there is any layout candidate data not yet subjected to the selection (Yes at S9), the control part 20 selects layout candidate data as an evaluation object from a plurality of layout candidate data not yet subjected to the selection, and causes the sequence to return to a position immediately after the S1. Consequently, a process for acquiring pattern contours for the adaptation object layer Lop (S2 to S3) and a process for acquiring contours for the upper layer Lup/the lower layer Ldn (S4 to S5) are performed in parallel with each other.

If there is no layout candidate data not yet subjected to the selection (No at S9), the control part 20 selects proper layout data for the adaptation object layer Lop, from the plurality of layout candidate data 41, based on the overlap areas OVA calculated in the S7 and the proximity distances PD calculated in the S8.

For example, the control part 20 selects layout candidate data that satisfies the overlap area related criteria and the proximity distance related criteria, from the plurality of layout candidate data 41. The control part 20 makes a judgment as to whether or not the layout candidate data thus selected is sole layout candidate data (S10).

For example, in the case of selection of proper layout data by use of an interactive process, when the control part 20 receives a selecting instruction for selecting the sole layout candidate data from a user through the input part 60, it judges that the layout candidate data thus selected is sole layout candidate data.

Alternatively, for example, in the case of selection of proper layout data by use of a hatch process, the control part 20 compares the overlap areas with the overlap area related criteria, for each of the plurality of layout candidate data 41. The control part 20 compares the proximity distances with the proximity distance related criteria, for each of the plurality of layout candidate data 41. When sole layout candidate data is selected in accordance with these comparison results, the control part 20 judges that the layout candidate data thus selected is sole layout candidate data.

If there are a plurality of selected layout candidate data (No at S10), the control part 20 performs processes based on comparison between focus tolerances and/or exposure amount tolerances of overlap area and focus tolerances and/or exposure amount tolerances of proximity distance, for the plurality of selected layout candidate data (S11).

For example, in the case of selection of proper layout data by use of an interactive process, a selecting instruction for selecting layout candidate data largest in focus tolerance and/or exposure amount tolerance is input into the control part 20 by a user through the input part 60.

For example, in the case of selection of proper layout data by use of a batch process, the control part 20 compares overlap areas relative to a plurality of focus values different from each other, with the overlap area related criteria, for each of the plurality of layout candidate data that satisfy the overlap area related criteria. The control part 20 compares overlap areas relative to a plurality of exposure amounts different from each other, with the overlap area related criteria, for each of the plurality of layout candidate data that satisfy the overlap area related criteria. The control part 20 compares proximity distances relative to a plurality of focus values different from each other, with the proximity distance related criteria, for each of the plurality of layout candidate data that satisfy the proximity distance related criteria. The control part 20 compares proximity distances relative to a plurality of exposure amounts different from each other, with the proximity distance related criteria, for each of the plurality of layout candidate data that satisfy the proximity distance related criteria. In accordance with these comparison results, the control part 20 obtains layout candidate data that is largest in focus tolerance and/or exposure amount tolerance.

If the layout candidate data thus selected is sole (Yes at S10), the control part 20 selects this sole layout candidate data as proper layout data (S12).

Alternatively, upon completion of the processes based on comparison between focus tolerances and/or exposure amount tolerances of overlap area and focus tolerances and/or exposure amount tolerances of proximity distance, the control part 20 selects proper layout data, in accordance with the results of the processes based on the comparison, from the plurality of layout candidate data that satisfy the overlap area related criteria and the proximity distance related criteria.

For example, in the case of selection of proper layout data by use of an interactive process, the control part 20 selects layout candidate data instructed by a selecting instruction in the S11, as proper layout data (S12).

For example, in the case of selection of proper layout data by use of a batch process, the control part 20 selects layout candidate data that is largest in focus tolerance and/or exposure amount tolerance, as proper layout data (S12).

Thereafter, the control part 20 generates data 47 of the mask MK including the proper layout data selected in the S12, and stores it in the storage part 40 (S13).

Figure 17:
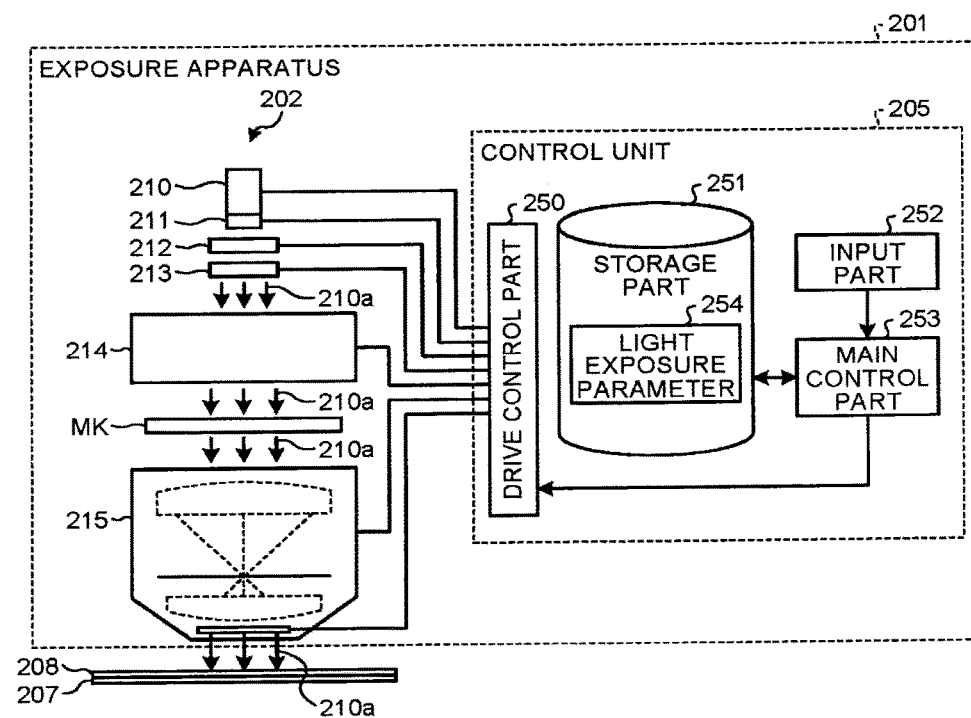
FIG. 17 is a view showing a configuration of an exposure apparatus for performing a light exposure process by use of a mask produced by the mask data generation method according to the embodiment.

Next, with reference to FIG. 17, an explanation will be given of a configuration of the exposure apparatus 201 for performing a light exposure process by use of the mask MK produced as described above. FIG. 17 is a view showing a configuration of the exposure apparatus 201.

The exposure apparatus 201 includes an exposure apparatus main body 202 and a control unit 205. The control unit 205 includes an input part 252, a main control part 253, a storage part 251, and a drive control part 250. The main control part 253 receives an input of light exposure parameters (such as an exposure amount and a focus value) through the input part 252, and stores them in the storage part 251 as light exposure parameter information 254. Further, the main control part 253 controls the respective portions of the exposure apparatus main body 202 through the drive control part 250, based on the light exposure parameter information 254.

The exposure apparatus main body 202 includes a light source 210, an aperture diaphragm 211, a filter 212, a polarization filter 213, an illumination optical system 214, and a projection optical system 215.

For example, the aperture diaphragm 211 has an approximately circular disk shape, and includes a light emitting region (illumination region) and a non-light emitting region (illumination shield region). The non-light emitting region is a region for shielding exposure light 210a emitted from the light source 210, and the light emitting region is a region for transmitting the exposure light 210a emitted from the light source 210. Thus, the aperture diaphragm 211 is configured to adjust the illumination shape. In accordance with this, the mask MK is irradiated with illumination light by the illumination optical system 214, so that a latent image is formed onto a photosensitive material (such as a resist) 208 on a substrate 207, through the projection optical system 215. FIG. 17 shows an example where the mask MK is a transmission type mask, but the mask MK may be a reflection type mask.

As described above, according to this embodiment, pattern contour data for the adaptation object layer and pattern contour data for the upper/lower layers are acquired and superimposed with each other to obtain data, for each of a plurality of layout candidate data for the adaptation object layer. Then, on each of the superimpose data, an overlap areas between a pattern for the adaptation object layer and a pattern for the upper/lower layers, which need to be electrically connected to each other, is evaluated. Consequently, there can be obtained evaluation indexes, each of which is indicative of the degree of a contact resistance value between a pattern for the adaptation object layer and a pattern for the upper/lower layers, which need to be electrically connected to each other, so that, even if criteria for the resistance value between patterns in semiconductor devices becomes stricter, it is possible to satisfy such stricter criteria. In other words, in place of evaluation performed solely to the adaptation object layer, evaluation can be performed in consideration of the upper/lower layers as well, and so mask data can be generated by selecting a proper layout in relation to patterns for the upper/lower layers from a plurality of layout candidates.

Further, according to this embodiment, on each of the superimpose data, a proximity distance between a pattern for the adaptation object layer and a pattern for the upper/lower layers, which need to be electrically separated from each other, is evaluated. Consequently, there can be obtained evaluation indexes, each of which is indicative of the easiness of short between a pattern for the adaptation object layer and a pattern for the upper/lower layers, which need to be electrically separated from each other, so that, even if criteria for the breakdown voltage between patterns in semiconductor devices becomes stricter, it is possible to satisfy such stricter criteria. In other words, in place of evaluation performed solely to the adaptation object layer, evaluation can be performed in consideration of the upper/lower layers as well, and so mask data can be generated by selecting a proper layout in relation to patterns for the upper/lower layers from a plurality of layout candidates.

Figure 18:
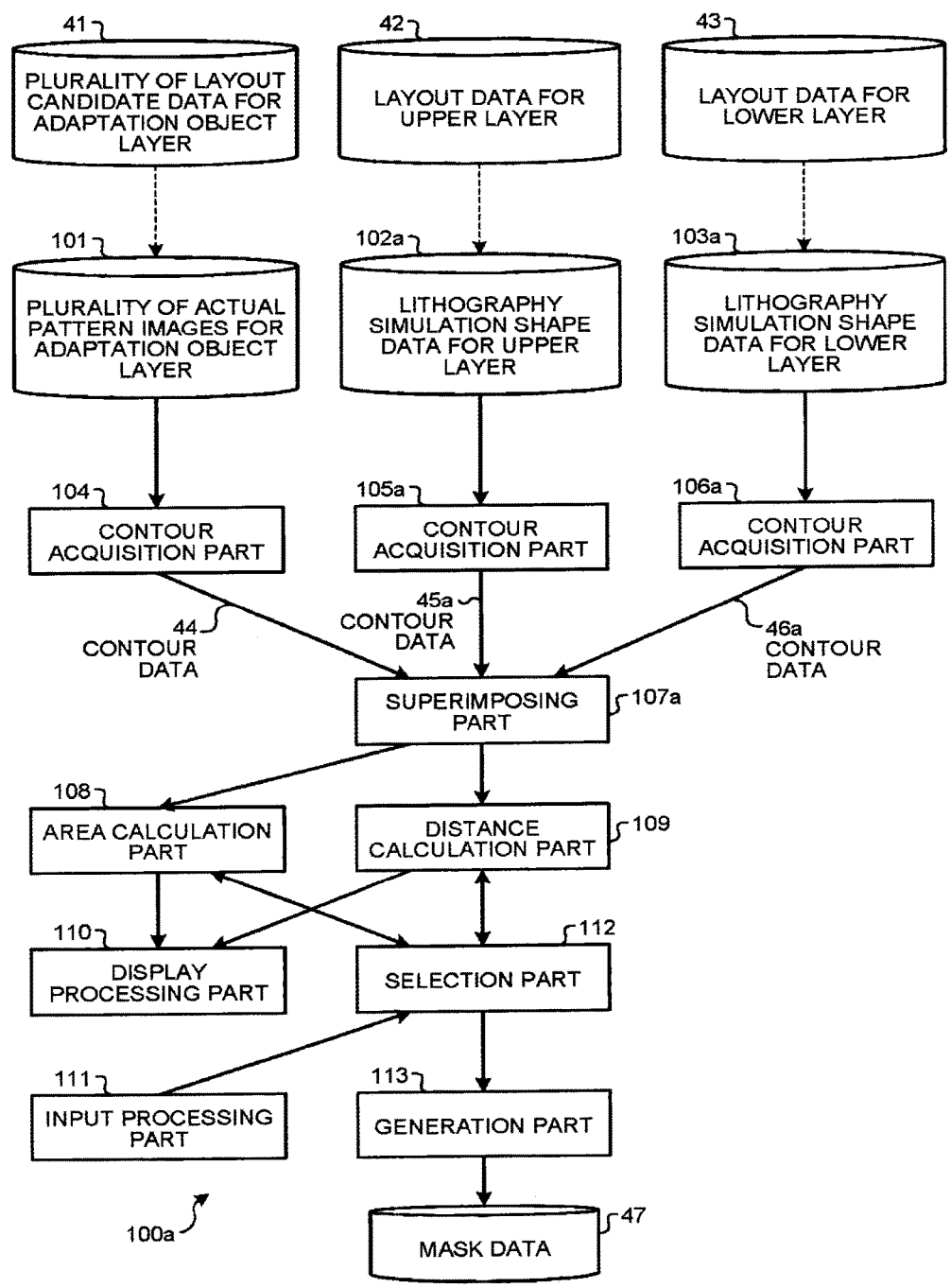
FIG. 18 is a view showing a configuration of a mask data generation system according to a modification of the embodiment.

It should be noted that, as shown in FIG. 18, there may be provided a mask data generation system 100*a* in which contour acquisition parts 105 and 106 are configured to acquire shape data generated by a lithography simulation, in place of the actual pattern images 102 and 103 obtained by measuring actual patterns formed on trial substrates. FIG. 18 is a block diagram showing a configuration of the mask data generation system 100*a*.

Figure 19:
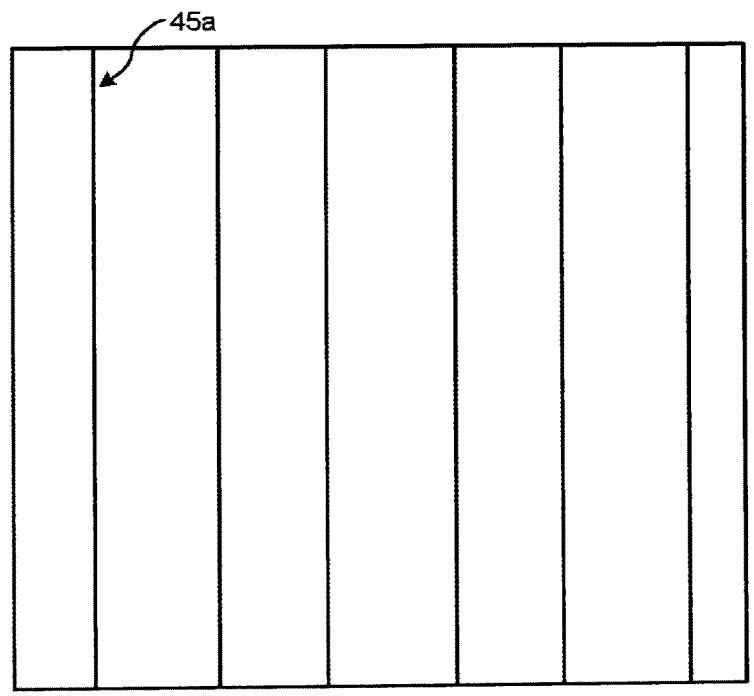
FIG. 19 is a view showing pattern contour data for an upper layer in the modification of the embodiment.
Figure 20:
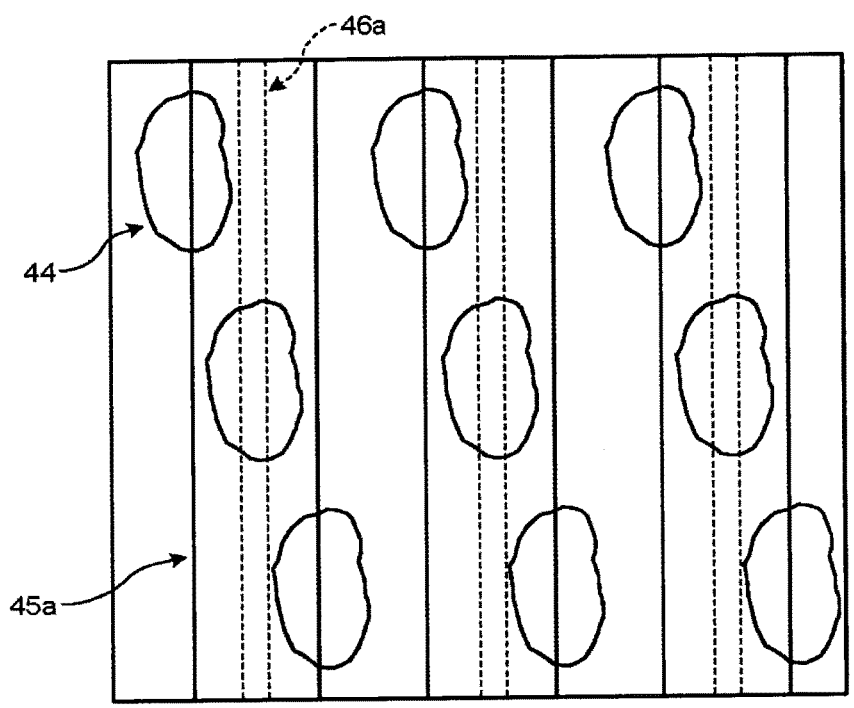
FIG. 20 is a view showing data obtained by superimposing contour data for the adaptation object layer with contour data for the upper/lower layers in the modification of the embodiment.
Figure 21:
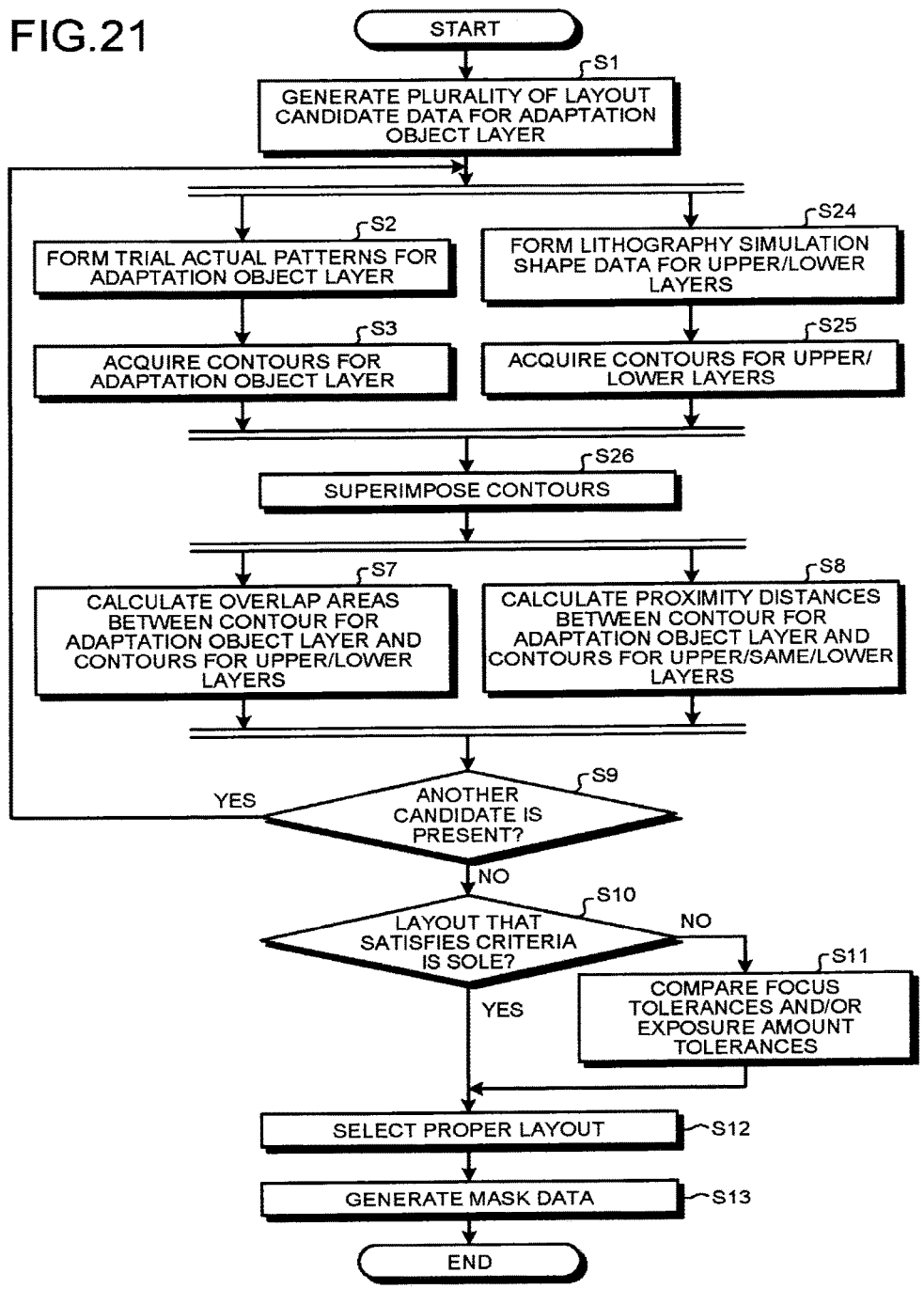
FIG. 21 is a flow chart showing a mask data generation method according to the modification of the embodiment.

More specifically, processes shown in FIGS. 19 to 21 are performed. FIG. 19 is a view showing pattern contour data 45 for the upper layer Lup. FIG. 20 is a view showing data obtained by superimposing contour data for the adaptation object layer with contour data for the upper/lower layers. FIG. 21 is a flow chart showing a mask data generation method.

An information processing apparatus (not shown) perform a lithography simulation in accordance with layout data 42 and 43, and thereby generates shape data 102*a* and 103*a* of patterns included in the layout data 42 and 43 (S24).

A contour acquisition part 105*a* acquires the shape data 102*a* generated by the lithography simulation, for the upper layer Lup (S25). The shape data 102*a* corresponds to the layout data 42 for the upper layer Lup. The contour acquisition part 105*a* acquires the shape data 102*a* for the layout data 42.

The contour acquisition part 105*a* acquires contour data 45*a* of an evaluation object pattern from the shape data 102*a*, for the layout data 42. For example, as shown in FIG. 19, the contour acquisition part 105*a* extracts a contour portion in the shape data 102*a* as contour data 45*a* of an evaluation object pattern. Consequently, the contour acquisition part 105*a* can acquire a pattern contour included in the layout data 42 by use of simple processes.

Similarly, a contour acquisition part 106*a* acquires the shape data 103*a* generated by the lithography simulation, for the lower layer Ldn. The shape data 103*a* corresponds to the layout data 43 for the lower layer Ldn. The contour acquisition part 106*a* acquires the shape data 103*a* for the layout data 42.

The contour acquisition part 106*a* acquires contour data 46*a* of an evaluation object pattern from the shape data 103*a*, for the layout data 43. For example, the contour acquisition part 106*a* extracts a contour portion in the shape data 103*a* as contour data 46*a* of an evaluation object pattern (see FIG. 19). Consequently, the contour acquisition part 106*a* can acquire a pattern contour included in the layout data 43 by use of simple processes.

For example, as shown in FIG. 20, a superimposing part 107*a* superimposes the pattern contour data 44 for the adaptation object layer Lop, the pattern contour data 45*a* for the upper layer Lup, and the pattern contour data 46*a* for the lower layer Ldn, with each other (S26).

As described above, the contour data 45*a* and 46*a* for the upper layer/the lower layer can be acquired by simple processes, and so it is possible to easily shorten the time necessary for processes for selecting proper layout data from a plurality of layout candidate data 41.

Further, as regards the pattern contour data 44 for the adaptation object layer Lop, contour data 44 more approximated to the actual contour can be acquired, and so it is possible to maintain the accuracy in selecting proper layout data from a plurality of layout candidate data 41.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask data generation system that generates data of a mask, the mask generation system being realized in a computer and comprising:
    a first acquisition part configured to acquire pattern contour data included in each of a plurality of layout candidate data for a first layer;
    a second acquisition part configured to acquire pattern contour data included in layout data for a second layer;
    a third acquisition part configured to acquire pattern contour data included in layout data for a third layer;
    a superimposing part configured to superimpose the contour data acquired by the first acquisition part and the contour data acquired by the second acquisition part with each other to obtain a first superimposed data for each of the plurality of layout candidate data, and to superimpose the contour data acquired by the first acquisition part and the contour data acquired by the third acquisition part with each other to obtain a second superimposed data for each of the plurality of layout candidate data;
    an area calculation part configured to calculate an overlap area between a first pattern in the contour data acquired by the first acquisition part and a second pattern in the contour data acquired by the second acquisition part, based on the first superimposed data, for each of the plurality of layout candidate data;
    a distance calculation part configured to calculate a proximity distance between a first pattern in the contour data acquired by the first acquisition part and a third pattern in the contour data acquired by the third acquisition part, based on the second superimposed data, for each of the plurality of layout candidate data;
    a selection part configured to select proper layout data for the first layer from the plurality of layout candidate data, based on an overlap area between the first pattern and the second pattern and a proximity distance between the first pattern and the third pattern; and
    forming a latent image on a photosensitive material on a substrate by using the selected proper layout data and illumination light from a projection optical system.

2. The mask data generation system according to claim 1, further comprising:
a generation part configured to generate mask data including the proper layout data selected by the selection part.

3. The mask data generation system according to claim 2, further comprising:
a display processing part configured to display information concerning the calculated overlap areas, for the plurality of layout candidate data, on a screen, and to display information concerning the calculated proximity distances, for the plurality of layout candidate data, on a screen,
wherein the selection part is configured to select proper layout data for the first layer from the plurality of layout candidate data, for which the information is displayed, in accordance with a selecting instruction from a user.

4. The mask data generation system according to claim 2, wherein
the selection part is configured to compare the calculated overlap areas, between the plurality of layout candidate data, and to select proper layout data for the first layer from the plurality of layout candidate data, in accordance with a comparison result, and to compare the calculated proximity distances, between the plurality of layout candidate data, and to select proper layout data for the first layer from the plurality of layout candidate data, in accordance with a comparison result.

5. The mask data generation system according to claim 1, wherein
the first pattern and the second pattern are patterns that need to be electrically connected to each other, and
the first pattern and the third pattern are patterns that need to be electrically separated from each other.

6. The mask data generation system according to claim 1, wherein
the selection part includes a first criterion for overlap area and a second criterion for proximity distance, and is configured to select layout candidate data, in which an overlap area between the first pattern and the second pattern satisfies the first criterion and a proximity distance between the first pattern and the third pattern satisfies the second criterion, as the proper layout data.

7. The mask data generation system according to claim 6, wherein,
for a case where there are a plurality of layout candidate data, in which an overlap area between the first pattern and the second pattern satisfies the first criterion and a proximity distance between the first pattern and the third pattern satisfies the second criterion, the selection part is configured to select sole layout candidate data from a plurality of layout candidate data that satisfy the first criterion and the second criterion, based on focus tolerance and/or exposure amount tolerance of overlap area and/or proximity distance in the plurality of layout candidate data that satisfy the first criterion and the second criterion.

8. The mask data generation system according to claim 7, wherein
the selection part is configured to select layout candidate data that is largest in the focus tolerance and/or the exposure amount tolerance of overlap area and/or proximity distance, from the plurality of layout candidate data that satisfy the first criterion and the second criterion, as the proper layout data.

9. The mask data generation system according to claim 1, wherein
the distance calculation part is configured to calculate a proximity distance between a first pattern in the contour data acquired by the first acquisition part and a fourth pattern in the contour data acquired by the first acquisition part, for each of the plurality of layout candidate data, and
the selection part is configured to select proper layout data for the first layer from the plurality of layout candidate data, based on an overlap area between the first pattern and the second pattern, a proximity distance between the first pattern and the third pattern, and a proximity distance between the first pattern and the fourth pattern.

10. The mask data generation system according to claim 9, wherein
the first pattern and the second pattern are patterns that need to be electrically connected to each other,
the first pattern and the third pattern are patterns that need to be electrically separated from each other, and
the first pattern and the fourth pattern are patterns that need to be electrically separated from each other.

11. The mask data generation system according to claim 9, wherein
the selection part includes a first criterion for overlap area and a second criterion for proximity distance, and is configured to select layout candidate data, in which an overlap area between the first pattern and the second pattern satisfies the first criterion, a proximity distance between the first pattern and the third pattern satisfies the second criterion, and a proximity distance between the first pattern and the fourth pattern satisfies the second criterion, as the proper layout data.

12. The mask data generation system according to claim 1, wherein
the first acquisition part is configured to extract contour data from an image obtained by measuring an actual pattern formed on a substrate in accordance with each of a plurality of layout candidate data for the first layer, and
the second acquisition part is configured to extract contour data from an image obtained by measuring an actual pattern formed on a substrate in accordance with layout data for the second layer.

13. The mask data generation system according to claim 1, wherein
the first acquisition part is configured to extract contour data from an image obtained by measuring an actual pattern formed on a substrate in accordance with each of a plurality of layout candidate data for the first layer, and
the second acquisition part is configured to extract contour data from shape data generated by a lithography simulation in accordance with layout data for the second layer.

14. A mask data generation method of generating data of a mask, the method being performed by a computer and comprising:
acquiring pattern contour data included in each of a plurality of layout candidate data for a first layer;
acquiring pattern contour data included in layout data for a second layer;
acquiring pattern contour data included in layout data for a third layer;
superimposing the contour data acquired for the first layer and the contour data acquired for the second layer with each other to obtain a first superimposed data for each of the plurality of layout candidate data;

superimposing the contour data acquired for the first layer and the contour data acquired for the third layer with each other to obtain a second superimposed data for each of the plurality of layout candidate data;

calculating an overlap area between a first pattern in the contour data acquired for the first layer and a second pattern in the contour data acquired for the second layer, based on the first superimposed data, for each of the plurality of layout candidate data;

calculating a proximity distance between a first pattern in the contour data acquired for the first layer and a third pattern in the contour data acquired for the third layer, based on the second superimposed data, for each of the plurality of layout candidate data;

selecting proper layout data for the first layer from the plurality of layout candidate data, based on an overlap area between the first pattern and the second pattern and a proximity distance between the first pattern and the third pattern; and forming a latent image on a photosensitive material on a substrate by using the selected proper layout data and illumination light from a projection optical system.

15. The mask data generation method according to claim 14, further comprising:

generating mask data including the selected proper layout data.

16. A nontransitory computer readable recording medium that records a mask data generation program which causes a computer to generate data of a mask, the mask data generation program causing the computer to perform a method comprising:

acquiring pattern contour data included in each of a plurality of layout candidate data for a first layer;

acquiring pattern contour data included in layout data for a second layer;

acquiring pattern contour data included in layout data for a third layer;

superimposing the contour data acquired for the first layer and the contour data acquired for the second layer with each other to obtain a first superimposed data for each of the plurality of layout candidate data;

superimposing the contour data acquired for the first layer and the contour data acquired for the third layer with each other to obtain a second superimposed data for each of the plurality of layout candidate data;

calculating an overlap area between a first pattern in the contour data acquired for the first layer and a second pattern in the contour data acquired for the second layer, based on the first superimposed data, for each of the plurality of layout candidate data;

calculating a proximity distance between a first pattern in the contour data acquired for the first layer and a third pattern in the contour data acquired for the third layer, based on the second superimposed data, for each of the plurality of layout candidate data;

selecting proper layout data for the first layer from the plurality of layout candidate data, based on an overlap area between the first pattern and the second pattern and a proximity distance between the first pattern and the third pattern; and forming a latent image on a photosensitive material on a substrate by using the selected proper layout data and illumination light from a projection optical system.

17. The nontransitory computer readable recording medium according to claim 16, the mask data generation program causing the computer to further perform:

generating mask data including the selected proper layout data.

* * * * *